(12) United States Patent  
Berg et al.

(10) Patent No.: US 8,508,049 B2
(45) Date of Patent: Aug. 13, 2013

(54) DEPOSITION AND SELECTIVE REMOVAL OF CONDUCTING HELPLAYER FOR NANOSTRUCTURE PROCESSING

(75) Inventors: Jonas S. T. Berg, Hyssna (SE); Vincent Desmaris, Göteborg (SE); Mohammad Shafiqul Kabir, Gothenburg (SE); Muhammad Amin Saleem, Göteborg (SE); David Brud, Henån (SE)

(73) Assignee: Smoltek AB, Göteborg (SE)

( * ) Notice: Subject to any disclaimer, the term of this patent is extended or adjusted under 35 U.S.C. 154(b) by 15 days.

(21) Appl. No.: 12/392,017

(22) Filed: Feb. 24, 2009

(65) Prior Publication Data

US 2009/0233124 A1 Sep. 17, 2009

Related U.S. Application Data

(63) Continuation-in-part of application No. PCT/SE2009/000098, filed on Feb. 20, 2009.

(60) Provisional application No. 61/031,333, filed on Feb. 25, 2008.

(51) Int. Cl.
 *H01L 23/48* (2006.01)

(52) U.S. Cl.
 USPC .......................... 257/774; 977/762

(58) Field of Classification Search
 USPC .................... 257/E51.04, 774; 977/762
 See application file for complete search history.

(56) References Cited

U.S. PATENT DOCUMENTS

| 5,576,939 A | 11/1996 | Drummond |
| 5,584,972 A | 12/1996 | Lantsman |
| 5,651,865 A | 7/1997 | Sellers |
| 6,297,592 B1 | 10/2001 | Goren et al. |
| 6,331,209 B1 | 12/2001 | Jang et al. |
| 6,720,728 B2 | 4/2004 | Den |
| 6,724,017 B2 | 4/2004 | Semeria et al. |

(Continued)

FOREIGN PATENT DOCUMENTS

| CN | 1729137 A | 2/2006 |
| JP | 10-188778 | 7/1998 |

(Continued)

OTHER PUBLICATIONS

Adams, D. P. et al., "Microstructure and residual stress of very thin Mo films", *Thin Solid Films*, vol. 266 (1995), pp. 52-57.

(Continued)

*Primary Examiner* — Douglas Menz
(74) *Attorney, Agent, or Firm* — Fish & Richardson P.C.

(57) ABSTRACT

A method for making one or more nanostructures is disclosed, the method comprising: depositing a conducting layer on an upper surface of a substrate; depositing a patterned layer of catalyst on the conducting layer; growing the one or more nanostructures on the layer of catalyst; and selectively removing the conducting layer between and around the one or more nanostructures. A device is also disclosed, comprising a substrate, wherein the substrate comprises one or more exposed metal islands separated by one or more insulating areas; a conducting helplayer disposed on the substrate covering at least some of the one or more exposed metal islands or insulating areas; a catalyst layer disposed on the conducting helplayer; and one or more nanostructures disposed on the catalyst layer.

28 Claims, 12 Drawing Sheets

(56) References Cited

U.S. PATENT DOCUMENTS

| | | | |
|---|---|---|---|
| 6,737,939 B2 * | 5/2004 | Hoppe et al. | 333/186 |
| 6,739,932 B2 | 5/2004 | Yaniv et al. | |
| 6,858,197 B1 | 2/2005 | Delzeit | |
| 6,943,317 B1 | 9/2005 | Ilic et al. | |
| 6,962,823 B2 | 11/2005 | Empedocles et al. | |
| 6,965,513 B2 | 11/2005 | Montgomery et al. | |
| 6,982,519 B2 | 1/2006 | Guillorn et al. | |
| 7,026,174 B2 | 4/2006 | Fischer | |
| 7,084,507 B2 | 8/2006 | Awano | |
| 7,094,692 B2 | 8/2006 | Horibe et al. | |
| 7,682,973 B2 * | 3/2010 | Kim et al. | 438/680 |
| 7,687,876 B2 | 3/2010 | Kabir | |
| 7,777,291 B2 | 8/2010 | Kabir | |
| 8,106,517 B2 * | 1/2012 | Kabir et al. | 257/773 |
| 8,253,253 B2 | 8/2012 | Brud et al. | |
| 2002/0167375 A1 | 11/2002 | Hoppe et al. | |
| 2002/0185949 A1 | 12/2002 | Yaniv et al. | |
| 2003/0117770 A1 | 6/2003 | Montgomery et al. | |
| 2003/0236000 A1 | 12/2003 | Vogeli et al. | |
| 2004/0037972 A1 | 2/2004 | Simon et al. | |
| 2004/0058153 A1 | 3/2004 | Ren et al. | |
| 2004/0101468 A1 | 5/2004 | Liu et al. | |
| 2004/0161929 A1 | 8/2004 | Son et al. | |
| 2004/0182600 A1 | 9/2004 | Kawabata et al. | |
| 2004/0195957 A1 | 10/2004 | Hu et al. | |
| 2004/0251841 A1 | 12/2004 | Negishi et al. | |
| 2005/0046322 A1 | 3/2005 | Kim et al. | |
| 2005/0127351 A1 | 6/2005 | Tolt | |
| 2005/0212398 A1 | 9/2005 | Okano et al. | |
| 2005/0229837 A1 | 10/2005 | Marty et al. | |
| 2006/0091557 A1 | 5/2006 | Sakamoto et al. | |
| 2006/0148370 A1 | 7/2006 | Kadono et al. | |
| 2006/0238096 A1 * | 10/2006 | Han et al. | 313/311 |
| 2007/0154623 A1 | 7/2007 | Min et al. | |
| 2007/0243124 A1 | 10/2007 | Baughman et al. | |
| 2007/0259128 A1 | 11/2007 | Parsapour | |
| 2008/0001443 A1 | 1/2008 | Colglazier | |
| 2008/0075954 A1 | 3/2008 | Wardle et al. | |
| 2008/0090052 A1 | 4/2008 | Hori et al. | |
| 2008/0107892 A1 * | 5/2008 | Jiao et al. | 428/332 |
| 2008/0224115 A1 | 9/2008 | Bakkers et al. | |
| 2008/0232755 A1 | 9/2008 | Kabir | |
| 2009/0072408 A1 | 3/2009 | Kabir et al. | |
| 2010/0171093 A1 | 7/2010 | Kabir | |

FOREIGN PATENT DOCUMENTS

| | | |
|---|---|---|
| JP | 2000086216 | 3/2000 |
| JP | 2002117791 | 4/2002 |
| JP | 2002203473 | 7/2002 |
| JP | 2002289086 | 10/2002 |
| JP | 2003115257 | 4/2003 |
| JP | 2003115259 | 4/2003 |
| JP | 2003249163 | 9/2003 |
| JP | 2004055157 | 2/2004 |
| JP | 2004261875 | 9/2004 |
| JP | 2005116469 | 4/2005 |
| JP | 2006224296 | 8/2006 |
| WO | WO 03/055793 | 7/2003 |
| WO | WO 03/078305 | 9/2003 |
| WO | WO 2004/042830 | 5/2004 |
| WO | WO 2004/070854 | 8/2004 |
| WO | WO 2004/075275 | 9/2004 |
| WO | WO 2004/079450 | 9/2004 |
| WO | WO 2004/087564 | 10/2004 |
| WO | WO 2004/096699 | 11/2004 |
| WO | WO 2004/109815 | 12/2004 |
| WO | WO 2005/112126 | 11/2005 |
| WO | WO 2006/115453 | 11/2006 |
| WO | WO 2007/053202 | 5/2007 |

OTHER PUBLICATIONS

Ajayan, P. M., "How does a nanofibre grow?", *Nature*, vol. 427 (Jan. 29, 2004), pp. 402-403.

Avouris, P. et al., "Carbon Nanotube Electronics", *Proceedings of the IEEE*, vol. 91, No. 11 (Nov. 2003), pp. 1772-1784.

Awano, Y. et al., "Carbon nanotube technologies for future ULSIs", *2003 International Symposium on VLSI Technology, Systems, and Applications*, (2003), pp. 40-41.

Bachtold, A. et al., "Logic Circuits with Carbon Nanotube Transistors", *Science*, vol. 294 (Nov. 9, 2001), pp. 1317-1320.

Baker, R. T. K., "Catalytic growth of carbon filaments", *Carbon*, vol. 27, No. 3 (1989), pp. 315-323.

Baughman, R. H. et al., "Carbon Nanotubes—the Route Toward Applications", *Science*, vol. 297 (Aug. 2, 2002), pp. 787-792.

Baylor, L. R. et al., "Field emission from isolated individual vertically aligned carbon nanocones", *Journal of Applied Physics*, vol. 91, No. 7 (Apr. 1, 2002), pp. 4602-4606.

Bertness, K. A. et al., "Formation of AlN and GaN nanocolumns on Si(111) using molecular beam epitaxy with ammonia as a nitrogen source", *Phys. Stat. Sol. (c)*, vol. 2, No. 7 (Feb. 8, 2005), pp. 2369-2372.

Blase, X. et al., "Hybridization Effects and Metallicity in Small Radius Carbon Nanotubes", *Physical Review Letters*, vol. 72, No. 12 (Mar. 21, 1994), pp. 1878-1881.

Burke, P. J., "AC performance of nanoelectronics: towards a ballistic THz nanotube transistor", *Solid-State Electronics*, vol. 48 (2004), 1981-1986.

Cassell, A. M. et al., "Large Scale CVD Synthesis of Single-Walled Carbon Nanotubes", *J. Phys. Chem. B*, vol. 103 (1999), pp. 6484-6492.

Caughman, J. B. O. et al., "Growth of vertically aligned carbon nanofibers by low-pressure inductively coupled plasma-enhanced chemical vapor deposition", *Applied Physics Letters*, vol. 83, No. 6 (Aug. 11, 2003), pp. 1207-1209.

Cerofolini, G. F. et al., "A hybrid approach to nanoelectronics", *Nanotechnology*, vol. 16 (May 12, 2005), pp. 1040-1047.

Chen, B. et al., "Heterogeneous Single-Walled Carbon Nanotube Catalyst Discovery and Optimization", *Chem. Mater.*, vol. 14 (2002), pp. 1891-1896.

Chhowalla, M. et al., "Growth process conditions of vertically aligned carbon nanotubes using plasma enhanced chemical vapor deposition", *Journal of Applied Physics*, vol. 90, No. 10 (Nov. 15, 2001), pp. 5308-5317.

Choi, Y. C. et al., "Effect of surface morphology of Ni thin film on the growth of aligned carbon nanotubes by microwave plasma-enhanced chemical vapor deposition", *Journal of Applied Physics*, vol. 88, No. 8 (Oct. 15, 2000), pp. 4898-4903.

Chopra, N. et al., "Control of Multiwalled Carbon Nanotube Diameter by Selective Growth on the Exposed Edge of a Thin Film Multilayer Structure", *Nano Letters*, vol. 2, No. 10 (2002), 1177-1181.

Chopra, N. et al., "Incident angle dependence of nanogap size in suspended carbon nanotube shadow lithography", *Nanotechnology*, vol. 16 (Dec. 10, 2004), pp. 133-136.

Ciraci, S. et al., "Functionalized carbon nanotubes and device applications", *Journal of Physics: Condensed Matter*, vol. 16 (2004), pp. R901-R960.

Colomer, J. F. et al., "Large-scale synthesis of single-wall carbon nanotubes by catalytic chemical vapor deposition (CCVD) method", *Chemical Physics Letters*, vol. 317 (2000), pp. 83-89.

Conway, N. M. J. et al., "Defect and disorder reduction by annealing in hydrogenated tetrahedral amorphous carbon", *Diamond and Related Materials*, vol. 9 (2000), pp. 765-770.

Coquay, P. et al., "Carbon Nanotubes by a CVD Method. Part II: Formation of Nanotubes from (Mg, Fe)O Catalysts", *J. Phys. Chem. B*, vol. 106, No. 51 (2002), pp. 13199-13210.

Cui, H. et al., "Initial growth of vertically aligned carbon nanofibers", *Applied Physics Letters*, vol. 84, No. 20 (May 17, 2004), pp. 4077-4079.

Davis, J. F. et al., "High-Q Mechanical Resonator Arrays Based on Carbon Nanotubes", *Nanotechnology*, vol. 2 (Aug. 2003), pp. 635-638.

Dekker, C., "Carbon nanotubes as molecular quantum wires", *Physics Today*, (May 1999), pp. 22-28.

Delzeit, L. et al., "Growth of carbon nanotubes by thermal and plasma chemical vapour deposition processes and applications in microscopy", *Nanotechnology*, vol. 13 (2002), pp. 280-284.

Delzeit, L. et al., "Growth of multiwall carbon nanotubes in an inductively coupled plasma reactor", *Journal of Applied Physics*, vol. 91, No. 9 (May 1, 2002), pp. 6027-6033.

Delzeit, L. et al., "Multilayered metal catalysts for controlling the density of single-walled carbon nanotube growth", *Chemical Physics Letters*, vol. 348 (2001), pp. 368-374.

Delzeit, L. et al., "Multiwalled Carbon Nanotubes by Chemical Vapor Deposition Using Multilayered Metal Catalysts", *J. Phys. Chem. B.*, vol. 106 (2002), pp. 5629-5635.

Derycke, V. et al., "Carbon Nanotube Inter- and Intramolecular Logic Gates", *Nano Letters*, vol. 1, No. 9 (Sep. 2001), pp. 453-456.

Dong, L. et al., "Effects of catalysts on the internal structures of carbon nanotubes and corresponding electron field-emission properties", *Applied Physics A—Materials Science & Processing*, vol. 78 (2004), pp. 9-14.

Duesberg, G. S. et al., "Growth of Isolated Carbon Nanotubes with Lithographically Defined Diameter and Location", *Nano Letters*, vol. 3, No. 2 (2003), pp. 257-259.

Doraiswami, R. "Nano Nickel-Tin Interconnects and Electrodes for Next Generation 15 Micron Pitch Embedded Bio Fluidic Sensors in FR4 Substrates." 1-4244-0152-6, 2006 IEEE, 2006 Electronic Components and Technology Conference, pp. 1323-1325.

Emmenegger, C. et al., "Carbon nanotube synthesized on metallic substrates", *Applied Surface Science*, vol. 162-163 (2000), pp. 452-456.

Eres, G. et al., "In situ control of the catalyst efficiency in chemical vapor deposition of vertically aligned carbon nanotubes on predeposited metal catalyst films", *Applied Physics Letters*, vol. 84, No. 10 (Mar. 8, 2004), pp. 1759-1761.

Ferrari, A. C. et al., "Is stress necessary to stabilise $sp^3$ bonding in diamond-like carbon?", *Diamond and Related Materials*, vol. 11 (2002), pp. 994-999.

Frank, S. et al., "Carbon nanotube quantum resistors", *Science*, vol. 280 (Jun. 12, 1998), pp. 1744-1746.

Franklin, N. R. et al., "Integration of suspended carbon nanotube arrays into electronic devices and electromechanical systems", *Applied Physics Letters*, vol. 81, No. 5 (Jul. 29, 2002), pp. 913-915.

Fuhrer, M. S. et al., "High-Mobility Nanotube Transistor Memory", *Nano Letters*, vol. 2, No. 7 (2002), pp. 755-759.

Gerdes, S. et al., "Combing a carbon nanotube on a flat metal-insulator-metal nanojuction", *Europhysics Letters*, vol. 48, No. 3 (1999), pp. 292-298.

Graham, A. P. et al., "How do carbon nanotubes fit into the semiconductor roadmap?", *Applied Physics A—Materials Science & Processing*, vol. 80 (Mar. 11, 2005), pp. 1141-1151.

Guillorn, M. A. et al., "Individually addressable vertically aligned carbon nanofiber-based electrochemical probes", *Journal of Applied Physics*, vol. 91, No. 6 (Mar. 15, 2002), pp. 3824-3828.

Guo, J. et al., "Assessment of Silicon MOS and Carbon Nanotube FET Performance Limits Using a General Theory of Ballistic Transistors", *International Electron Devices Meeting (IEDM) Digest*, (2002), pp. 711-714.

Guo, T. et al., "Catalytic growth of single-walled nanotubes by laser vaporization", *Chemical Physics Letters*, vol. 243 (1995), pp. 49-54.

Hash, D. B. et al., "An investigation of plasma chemistry for dc plasma enhanced chemical vapour deposition of carbon nanotubes and nanofibres", *Nanotechnology*, vol. 16 (Apr. 19, 2005), pp. 925-930.

Hausler, K. et al., "Ordering of nanoscale InP islands on strain-modulated InGaP buffer layers", *Solid-State Electronics*, vol. 40, Nos. 1-8 (1996), pp. 803-806.

Heidari, B. et al., "Large scale nanolithography using nanoimprint lithography", *J. Vac. Sci. Technol. B*, vol. 17, No. 6 (Nov./Dec. 1999), pp. 2961-2964.

Heinze, S. et al., "Carbon Nanotubes as Schottky Barrier Transistors", *Physical Review Letters*, vol. 89, No. 10 (Sep. 2, 2002), pp. 106801.1-106801.4.

Helveg, S. et al., "Atomic-scale imaging of carbon nanofibre growth", *Nature*, vol. 427 (Jan. 29, 2004), pp. 426-429.

Hertel, T. et al., "Manipulation of Individual Carbon Nanotubes in Their Interaction with Surfaces", *J. Phys. Chem. B*, vol. 102, No. 6 (1998), pp. 910-915.

Hoenlein, W. et al., "Carbon nanotubes for microelectronics: status and future prospects", *Materials Science and Engineering C*, vol. 23 (2003), pp. 663-669.

Iijima, S. et al., "Carbon nanotubes: past, present, and future", *Physica B*, vol. 323 (2002), pp. 1-5.

Javey, A. et al., "Carbon Nanotube Field-Effect Transistors with Integrated Ohmic Contacts and High-$_K$ Gate Dielectrics", *Nano Letters*, vol. 4, No. 3 (Jan. 10, 2004), pp. 447-450.

Kabir, M. S., "Towards the Integration of Carbon Nanostructures into CMOS Technology", Thesis for the Degree of Doctor of Philosophy, Department of Microtechnology and Nanoscience, Chalmers University of Technology, Goteborg, Sweden, (Aug. 2005).

Kabir, M. S. et al., "Fabrication of individual vertically aligned carbon nanofibres on metal substrates from prefabricated catalyst dots", *Nanotechnology*, vol. 17, No. 3 (Jan. 10, 2006), pp. 790-794.

Kabir, M. S. et al., "Plasma-enhanced chemical vapour deposition growth of carbon nanotubes on different metal underlayers", *Nanotechnology*, vol. 16, No. 4 (Feb. 11, 2005), pp. 458-466.

Kempa, K. et al., "Photonic crystals based on periodic arrays of aligned carbon nanotubes", *Nano Letters*, vol. 3, No. 1 (2003), pp. 13-18.

Khomutov, G. B. et al., "Interfacial nanofabrication strategies in development of new functional nanomaterials and planar supramolecular nanostructures for nanoelectronics and nanotechnology", *Microelectronic Engineering*, vol. 69 (2003), pp. 373-383.

Kiselev, N. A. et al., "Carbon micro- and nanotubes synthesized by PE-CVD technique: Tube structure and catalytic particles crystallography", *Carbon*, vol. 42 (2004), 149-161.

Klein, D. L. et al., "An approach to electrical studies of single nanocrystals", *App. Phys. Lett.*, vol. 68, No. 18 (Apr. 29, 1996), pp. 2574-2576.

Kong, J. et al., "Chemical vapor deposition of methane for single-walled carbon nanotubes", *Chemical Physics Letters*, vol. 292 (1998), pp. 567-574.

Kreupl, F. et al., "Carbon nanotubes in interconnect applications", *Microelectronic Engineering*, vol. 64 (2002), pp. 399-408.

Kuang, M. H. et al., "Catalytically active nickel {110} surfaces in growth of carbon tubular structures", *Applied Physics Letters*, vol. 76, No. 10 (Mar. 6, 2000), pp. 1255-1257.

Lacerda, R. G. et al., "Growth of high-quality single-wall carbon nanotubes without amorphous carbon formation", *Applied Physics Letters*, vol. 84, No. 2 (Jan. 12, 2004), pp. 269-271.

Laplaze, D. et al., "Carbon nanotubes: the solar approach", *Carbon*, vol. 36, No. 5-6 (1998), pp. 685-688.

Lee, B. et al., "A Novel SET/MOSFET Hybrid Static Memory Cell Design", *IEEE Transactions on Nanotechnology*, vol. 3, No. 3 (Sep. 2004), pp. 377-382.

Lee, S. B. et al., "Characteristics of multiwalled carbon nanotube nanobridges fabricated by poly(methylmethacrylate) suspended dispersion", *J. Vac. Sci. Technol. B.*, vol. 20, No. 6 (Nov./Dec. 2002), pp. 2773-2776.

Lee, S. W. et al., "A Three-Terminal Carbon Nanorelay", *Nano Letters*, vol. 4, No. 10 (Jul. 15, 2004), pp. 2027-2030.

Li, J. et al., "Carbon Nanotube Interconnects: A Process Solution", *Proceedings of the 2003 IEEE International*, (2003), 271-272.

Li, M. et al., "Low-temperature synthesis of carbon nanotubes using corona discharge plasma reaction at atmospheric pressure", *Journal of Materials Science Letters*, vol. 22 (2003), pp. 1223-1224.

Liao, K. et al., "Effects of Ni-catalyst characteristics on the growth of carbon nanowires", *Carbon*, vol. 42 (2004), pp. 509-514.

Liu, Z. et al., "Porous silicon: a possible buffer layer for diamond growth on silicon substrates", *Materials Research Society Symposium Proceedings*, vol. 358 (1995), pp. 805-809.

Lundstrom, M., "A Top-Down Look at Bottom-Up Electronics", *2003 Symposium on VLSI Circuits Digest of Technical Papers*, (2003), pp. 5-8.

Maeng, S. L. et al., "A carbon based bottom gate thin film transistor", *Diamond and Related Materials*, vol. 9 (2000), pp. 805-810.

Martel, R. et al., "Ambipolar Electrical Transport in Semiconducting Single-Wall Carbon Nanotubes", *Physical Review Letters*, vol. 87, No. 25 (Dec. 17, 2001), pp. 256805.1-256805.4.

Martel, R., "Nanotube Electronics: High-performance transistors", *Nature Materials*, vol. 1 (Dec. 2002), pp. 203-204.

Merkulov, V. I. et al., "Growth rate of plasma-synthesized vertically aligned carbon nanofibers", *Chemical Physics Letters*, vol. 361 (2002), pp. 492-498.

Meyyappan, M. et al., "Carbon nanotube growth by PECVD: a review", *Plasma Sources Sciences and Technology*, vol. 12 (2003), pp. 205-216.

Morjan, R. E. et al., "Selective growth of individual multiwalled carbon nanotubes", *Current Applied Physics*, vol. 4, No. 6 (Nov. 2004), pp. 591-594.

Nabet, B. et al., "Local Variation of Metal-Semiconducting Carbon Nanotube Contact Barrier Height", *Proceedings of the 2002 2nd IEEE Conference on Nanotechnology, IEEE-NANO 2002*, (Aug. 28, 2002), pp. 435-438.

Naeemi, A. et al., "Monolayer Metallic Nanotube Interconnects: Promising Candidates for Short Local Interconnects", *IEEE Electron Device Letters*, vol. 26, No. 8 (Aug. 2005), pp. 544-546.

Natsuki, T. et al., "Effects of carbon nanotube structures on mechanical properties", *Applied Physics A—Materials Science & Processing*, vol. 79 (Feb. 27, 2004), pp. 117-124.

Ng, H. T. et al., "Growth of Carbon Nanotubes: A Combinatorial Method To Study the Effects of Catalysts and Underlayers", *J. Phys. Chem. B*, vol. 107, No. 33 (2003), pp. 8484-8489.

Nihei, M. et al., "Carbon nanotube vias for future LSI interconnects", *Proceedings of the IEEE 2004 International Interconnect Technology Conference*, (2004), pp. 251-253.

Nikolaev, P. et al., "Gas-phase catalytic growth of single-walled carbon nanotubes from carbon monoxide", *Chemical Physics Letters*, vol. 313 (1999), pp. 91-97.

Nolan, P. E. et al., "Carbon Deposition and Hydrocarbon Formation on Group VIII Metal Catalysts", *J. Phys. Chem. B*, vol. 102 (1998), 4165-4175.

Nuzzo, R. G. et al., "Adsorption of Bifunctional Organic Disulfides on Gold Surfaces", *J. Am. Chem. Soc.*, vol. 105 (1983), pp. 4481-4483.

Oberlin, A. et al., "High resolution electron microscope observations of graphitized carbon fibers", *Carbon*, vol. 14 (1976), pp. 133-135.

Odom, T. W. et al., "Atomic structure and electronic properties of single-walled carbon nanotubes", *Nature*, vol. 391 (Jan. 1, 1998), pp. 62-64.

Ondrejcek, M. et al., "Low energy electron microscopy investigations of kinetics and energetics on clean close-packed metal surfaces", *Journal of Physics: Condensed Matter*, vol. 17 (Apr. 8, 2005), pp. S1397-S1406.

Popov, V. N., "Carbon nanotubes: properties and application", *Materials Science and Engineering R.*, vol. 43 (2004), pp. 61-102.

Prylutskyy, Y. I. et al., "Molecular dynamics simulation of mechanical, vibrational and electronic properties of carbon nanotubes", *Computational Materials Science*, vol. 17 (2000), pp. 352-355.

Raffaelle, R. P. et al., "Carbon nanotubes for power applications", *Materials Science and Engineering B*, vol. 116 (2005), pp. 233-243.

Raja, T. et al., "A Tutorial on the Emerging Nanotechnology Devices", *Proceedings of the 17th International Conference on VLSI Design (VLSID '04)*, (2004), 18 pages.

Saito, R. et al., "Chapters 1.1 and 1.2: Carbon Materials", *Physical Properties of Carbon Nanotubes*, Imperial College Press, London, England, (1998), pp. 1-15.

Saito, Y. et al., "Interlayer spacings in carbon nanotubes", *Physical Review B*, vol. 48, No. 3 (Jul. 15, 1993), pp. 1907-1909.

Sapmaz, S. et al., "Carbon nanotubes as nanoelectromechanical systems", *Physical Review B*, vol. 67 (2003), pp. 235414.1-235414.7.

Sato, S. et al., "Carbon nanotube growth from titanium-cobalt bimetallic particles as a catalyst", *Chemical Physics Letters*, vol. 402 (Dec. 22, 2004), pp. 149-154.

Seidel, R. et al., "High-Current Nanotube Transistors", *Nano Letters*, vol. 4, No. 5 (Mar. 25, 2004), pp. 831-834.

Shan, B. et al., "Ab initio study of Schottky barriers at metal-nanotube contacts", *Physical Review B*, vol. 70 (Dec. 9, 2004), pp. 233405.1-233405.4.

Sinnott, S. B. et al., "Model of carbon nanotube growth through chemical vapor deposition", *Chemical Physics Letters*, vol. 315 (1999), pp. 25-30.

Stan, M. R. et al., "Molecular Electronics: From Devices and Interconnect to Circuits and Architecture", *Proceedings of the IEEE*, vol. 91, No. 11 (Nov. 2003), pp. 1940-1957.

Tanemura, M. et al., "Growth of aligned carbon nanotubes by plasma-enhanced chemical vapor deposition: Optimization of growth parameters", *Journal of Applied Physics*, vol. 90, No. 3 (Aug. 1, 2001), pp. 1529-1533.

Tang, Z. K. et al., "Mono-sized single-wall carbon nanotubes formed in channels of $AlPO_4$-5 single crystal", *Applied Physics Letters*, vol. 73, No. 16 (Oct. 19, 1998), pp. 2287-2289.

Tans, S. J. et al., "Individual single-wall carbon nanotubes as quantum wires", *Nature*, vol. 386 (Apr. 3, 1997), pp. 474-477.

Teo, K. B. K. et al., "Characterization of plasma-enhanced chemical vapor deposition carbon nanotubes by Auger electron spectroscopy", *J. Vac. Sci. Technol. B*, vol. 20, No. 1 (Jan./Feb. 2002), pp. 116-121.

Teo, K. B. K. et al., "Plasma enhanced chemical vapour deposition carbon nanotubes/nanofibres—how uniform do they grow?", *Nanotechnology*, vol. 14, No. 2 (2003), pp. 204-211.

Thompson, S. et al., "A 90 nm Logic Technology Featuring 50nm Strained Silicon Channel Transistors, 7 layers of Cu Interconnects, Low k ILD, and 1 $um^2$ SRAM Cell", *IEDM: International Electron Devices Meeting* (held at San Francisco, California on Dec. 8-11, 2002) Technical Digest, (Aug. 12, 2002), pp. 61-64.

Tseng, Y. et al., "Monolithic Integration of Carbon Nanotube Devices with Silicon MOS Technology", *Nano Letters*, vol. 4, No. 1 (2004), pp. 123-127.

Vander Wal, R. L. et al., "Diffusion flame synthesis of single-walled carbon nanotubes", *Chemical Physics Letters*, vol. 323 (2000), pp. 217-223.

Yang, R. T. et al., "Mechanism of Carbon Filament Growth on Metal Catalysts", *Journal of Catalysis*, vol. 115 (1989), pp. 52-64.

Yang, X. et al., "Fabrication and Characterization of Carbon Nanofiber-Based Vertically Integrated Schottky Barrier Junction Diodes", *Nano Letters*, vol. 3, No. 12 (2003), pp. 1751-1755.

Yao, Y. et al., "Cross-sectional TEM investigation of nickel-catalysed carbon nanotube films grown by plasma-enhanced CVD", *Journal of Microscopy*, vol. 219, Pt. 2 (Aug. 2005), pp. 69-75.

Ye, Q. et al., "Large-Scale Fabrication of Carbon Nanotube Probe Tips for Atomic Force Microscopy Critical Dimension Imaging Applications", *Nano Letters*, vol. 4, No. 7 (May 24, 2004), pp. 1301-1308.

International Search Report for PCT Application No. PCT/SE2006/000487, mailed Jan. 9, 2006, 16 pages.

International Preliminary Report on Patentability for PCT Application No. PCT/SE2006/000487, mailed Apr. 13, 2007, 12 pages.

International Search Report for PCT Application No. PCT/IB2006/004279, mailed Apr. 24, 2008, 3 pages.

International Preliminary Report on Patentability and Written Opinion for PCT/IB2006/004279, mailed May 14, 2008, 7 pages.

International Search Report and Written Opinion for PCT Application No. PCT/SE2006/000983, mailed Feb. 12, 2007, 12 pages.

International Search Report and Written Opinion for PCT Application No. PCT/SE2007/000951, mailed Feb. 6, 2008, 9 pgs.

International Preliminary Report on Patentability for PCT Application No. PCT/SE2007/000951, mailed Feb. 6, 2008, 10 pages.

International Search Report and Written Opinion for PCT Application No. PCT/SE2008/000506, mailed Jan. 30, 2009, 10 pages.

International Preliminary Report on Patentability for PCT Application No. PCT/SE2008/000506, mailed Mar. 16, 2010, 8 pages.

First Notification of Office Action for Application No. 200680035406.7, dated Jun. 17, 2010, 10 pages.

Communication pursuant to Article 94(3) EPC for Application No. 06 733 343.5, dated Jan. 19, 2011, 5 pages.

Communication pursuant to Article 94(3) EPC for Application No. 06 850 481.0, dated Mar. 29, 2011, 7 pages.

English Translation of Japanese Office Action mailed Oct. 4, 2011, for JP Patent Application No. 2008-50795, 8 Pages.

Kim et al., "The interaction of hydrocarbons with copper-nickel and nickel in the formation of carbon filaments," *Journal of Catalysis*, 131, (1), 60, (1991).

Melechko et al., "Vertically aligned carbon nanofibers and related structures: Controlled synthesis and directed assembly," *J. App. Phys.*, 97(4), 41301, (2005).

Office Action issued in U.S. Appl. No. 13/570,634 on Feb. 1, 2013, 36 pages.

Chinese Office Action issued in 200980106183.2 on Feb. 6, 2013, 6 pages.

\* cited by examiner

US 8,508,049 B2

DEPOSITION AND SELECTIVE REMOVAL OF CONDUCTING HELPLAYER FOR NANOSTRUCTURE PROCESSING

CLAIM OF PRIORITY

This application is a continuation-in-part of international application serial number PCT/SE2009/000098, filed on Feb. 20, 2009, and claims the benefit of priority of U.S. provisional application Ser. No. 61/031,333, filed on Feb. 25, 2008, the content of which is incorporated herein by reference in its entirety.

TECHNICAL FIELD

The technology described herein is generally related to the field of chemical vapor deposition (CVD) of nanostructures, and more specifically to reduction or elimination of plasma-induced damages during growth of nanostructures, and enabling self-aligned growth of nanostructures on both conducting and insulating surfaces.

BACKGROUND

The present technology described herein is related to but not limited to nanostructures such as carbon nanostructures (e.g., carbon nanotubes, carbon nanofibers, and carbon nanowires). These nanostructures have gained interest in recent years due to their high thermal and electrical conductivities.

Carbon nanostructures can be manufactured with arc discharge methods, laser ablation, or chemical vapor deposition (CVD). A catalyst is used in CVD processing to obtain growth of the nanostructures. Two most frequently used CVD methods are thermal CVD and plasma-enhanced CVD (i.e., plasma CVD). In thermal CVD, the energy required for formation of the nanostructures is thermal energy. In plasma CVD, the energy required for formation of the nanostructures is from the plasma. Plasma CVD makes it possible to grow nanostructures at a lower temperature than that used in thermal CVD. The lower growth temperature in plasma CVD is a significant advantage as the substrates on which the nanostructures grow are often damaged at excessive temperatures.

Several types of plasma CVD exist, including radio-frequency plasma CVD, inductively-coupled plasma CVD and direct-current plasma CVD. Direct-current plasma CVD (DC-CVD) is often preferred since the electric field close to the substrate surface enables alignment of the growing nanostructures. In some instances, the electric field creates nanostructure alignment that is substantially perpendicular to the substrate. In some instances, alignment with other angular deviation from the perpendicular direction can also be achieved as desired.

FIGS. 1A-1E illustrate various configurations that nanostructures can be grown on a substrate. FIG. 1A illustrates a configuration for growing nanostructures 106 and/or 108 from a patterned catalyst layers 102 and/or 104 on a conducting substrate 100. Nanostructure 106 is a single nanostructure growing on a small catalyst dot 102, while nanostructures 108 is a "forest" of nanostructures (multiple closely-spaced nanostructures) growing on a large catalyst area 104. FIG. 1B illustrates a configuration for growing nanostructures 106 and/or 108 from a patterned catalyst layers 102 and/or 104 on a continuous metal underlayer 112 deposited on a insulating substrate 110. A small catalyst dot 102 gives rise to an individual nanostructure 106, while a large catalyst area 104 gives rise to a "forest" of nanostructures 108 (multiple closely-spaced nanostructures). These two configurations of using DC-CVD to grow nanostructures are relatively straight-forward.

However, problems arise if the patterned catalyst layers 102 and/or 104 are deposited directly on an insulator 110 (as shown in FIG. 1C) or on isolated metal islands 114 over an insulator 110 (as shown in FIG. 1D). The problems will most often occur if there are insulating areas around the metal islands, even if the metal islands are electrically connected to other parts of the substrate. Electric arcs will occur during the growth process, and cause damage to the growth structure due to sputtering. The arcs can also damage the electronic devices connected to the growth structures by the over-voltages produced by the arcs. FIG. 2 shows an example of damage caused on a substrate due to arcing. These over-voltages can damage the devices even if the devices are buried below several material layers, as the devices are electrically connected to the topmost metal layers. U.S. Pat. No. 5,651,865 provides a detailed description of the problems related to having insulating regions on an otherwise conducting surface in a DC plasma.

There are some proposed solutions describing improvements of the DC power supply to reduce the problems with arcs. For example, U.S. Pat. Nos. 5,576,939 and 6,943,317 disclose methods for shutting down or reversing the polarity of the power supply at the onset of an arc. U.S. Pat. No. 5,584,972 describes connecting an inductor and a diode between the power supply and the electrodes. U.S. Pat. No. 7,026,174 discloses putting the wafer at a bias voltage in order to reduce arcing. U.S. Pat. No. 5,651,865 discloses using a periodic polarity change of the plasma voltage to preferentially sputter away any insulator from an otherwise conductive surface, which does not enable the nanostructure growth on samples with insulating regions.

Methods for manufacturing nanofibers on a patterned metal underlayer have been shown for some applications in, for example, U.S. Pat. No. 6,982,519. The methods disclosed consist of growing the nanofibers on a continuous metal underlayer using a patterned catalyst layer, and afterwards patterning the metal underlayer using optical lithography. The disclosed method requires a continuous metal underlayer for the growth, and the patterning of the metal underlayer is made afterwards.

This technique disclosed in U.S. Pat. No. 6,982,519 is not compatible with standard (CMOS) processing of interconnect layers in integrated circuits, where the horizontal metal conductors 116 (e.g., in FIG. 1E) are formed in recesses in the interlayer dielectric using chemical mechanical polishing. After polishing, the next layers of vias (vertical interconnects) is formed on top and next to the interconnect layer. Thus any patterning of interconnects (to obtain patterned metal underlayers) should be done before the manufacturing of the next layer of vias.

With the methods disclosed in U.S. Pat. No. 6,982,519, it is not possible to grow nanostructures directly on an insulating substrate such that the substrate will remain insulating, as there will be metal remaining in between the nanostructures after lithography. In some applications, it is desirable to have the nanostructure-covered surface insulating (e.g., growing nanostructures on the insulating surface 110 in FIG. 1C), for example, in heat transport from insulators (where a continuous metal layer is unwanted).

Furthermore, it is inconvenient to grow nanostructures on existing metal islands (such as that shown in FIG. 1D), and the problem is exemplified by the plasma-induced chip damage as shown in the SEM picture in FIG. 2.

The configuration shown in FIG. 1E includes vias 118 (vertical interconnects) to some underlying (or overlying depending on the way the device is oriented) patterned metal underlayer 116. It would be preferable to grow nanostructures directly on the patterned metal underlayer 116 (horizontal interconnects) or any existing traditional-type vias 118 (vertical interconnects).

Another problem not addressed by U.S. Pat. No. 6,982,519 is that not all metals used in the manufacturing of integrated circuits are compatible with the plasma gases used for growth of nanostructures. For example, U.S. Application Publication No. 2008/00014443 states that it is not possible to use copper in an acetylene-containing plasma as there will be a detrimental chemical reaction.

U.S. Application Publication No. 2007/0154623 discloses a method for using a buffer layer between a glass substrate and the catalyst to prevent interaction. U.S. Application Publication No. 2007/0259128 discloses a method for using an interlayer to control the site density of carbon nanotubes. Neither of these applications fulfills the need for nanostructure growth on already patterned metal underlayers, or for arc elimination.

When growing nanostructures on a chip only partially covered by a metal underlayer, there is sometimes a parasitic growth outside the catalyst particles. This can cause unwanted leakage currents along the chip surface.

Therefore, there is a need of a method to grow the nanostructures on a previously patterned metal underlayer without having the problems of arc-induced chip damage and overvoltage damage of sensitive electronic devices, or problems due to incompatibility of materials used, parasitic growth during plasma growth processing. In various implementations, the technology described herein can solve some or all of these processing-related problems.

The discussion of the background to the invention herein is included to explain the context of the invention. This is not to be taken as an admission that all materials referred to was published, known, or part of the common general knowledge as at the priority date of any of the claims.

SUMMARY

The technology described herein is generally related to the field of chemical vapor deposition (CVD) of nanostructures, and more specifically to reduction or elimination of plasma-induced damages during growth processing of nanostructures, and enabling self-aligned growth of nanostructure on both conducting and insulating surfaces.

In one aspect, the method for making one or more nanostructures includes: depositing a conducting helplayer on an upper surface of a substrate; depositing a patterned layer of catalyst on the conducting helplayer; growing the one or more nanostructures on the layer of catalyst; and selectively removing the conducting helplayer between and around the one or more nanostructures.

In some implementations, the layer of catalyst is patterned after it is deposited. In some implementations, the substrate additionally comprises a metal underlayer, co-extensive with its upper surface, and which is covered by the conducting helplayer. In some implementations, the metal underlayer is patterned. In some implementations, the metal underlayer comprises one or more metals selected from: Cu, Ti, W, Mo, Pt, Al, Au, Pd, P, Ni, and Fe. In some implementations, the metal underlayer comprises one or more conducting alloys selected from: TiN, WN, and AlN. In some implementations, the metal underlayer comprises one or more conducting polymers. In some implementations, the substrate is a semiconductor. In some implementations, the substrate is an insulator. In some implementations, the substrate comprises an insulator with at least one conducting layer on top. In some implementations, any of the depositing is carried out by a method selected from: evaporating, plating, sputtering, molecular beam epitaxy, pulsed laser depositing, CVD, and spin-coating. In some implementations, the one or more nanostructures comprises carbon, GaAs, ZnO, InP, InGaAs, GaN, InGaN, or Si. In some implementations, the one or more nanostructures include nanofibers, nanotubes, or nanowires. In some implementations, the conducting helplayer comprises a material selected from: a semiconductor, a conducting polymer, and an alloy. In some implementations, the conducting helplayer is from 1 nm to 100 microns thick. In some implementations, the one or more nanostructures are grown in a plasma. In some implementations, the selective removal of the conducting helplayer is accomplished by etching. In some implementations, the etching is plasma dry etching. In some implementations, the etching is an electrochemical etching. In some implementations, the etching is photo chemical pyrolysis etching. In some implementations, the etching is pyrolysis etching. In some implementations, the method further includes depositing an additional layer between the conducting helplayer and the layer of catalyst.

In one aspect, a device includes a substrate, wherein the substrate comprising one or more exposed metal islands separated by one or more insulating areas; a conducting helplayer disposed on the substrate covering at least some of the one or more exposed metal islands or insulating areas; a catalyst layer disposed on the conducting helplayer; and one or more nanostructures disposed on the catalyst layer, wherein the conducting helplayer does not cover areas between and around the one or more nanostructures. In some implementations, the nanostructures are interconnects.

In one aspect, a method for making one or more nanostructures includes: depositing a metal underlayer on an upper surface of a substrate; depositing a catalyst layer on the metal underlayer; depositing an insulator layer on the catalyst layer; depositing a conducting helplayer on the insulator layer; creating via holes through the insulator layer from the conducting helplayer to the catalyst layer; growing the one or more nanostructures on the catalyst layer through the via holes; and selectively removing the conducting helplayer.

In one aspect, a device prepared by a process comprising: depositing a metal underlayer on an upper surface of a substrate; depositing a catalyst layer on the metal underlayer; depositing an insulator layer on the catalyst layer; depositing a conducting helplayer on the insulator layer; creating via holes through the insulator layer from the conducting helplayer to the catalyst layer; growing the one or more nanostructures on the catalyst layer through the via holes; and selectively removing the conducting helplayer, thereby forming the device.

In one aspect, A method for making one or more nanostructures includes: depositing a conducting helplayer on one or more intermediate layers on a substrate; growing the one or more nanostructures from a catalyst layer disposed on top of the helplayer or between the helplayer and the substrate; and selectively removing, by etching, either all of the conducting helplayer when the catalyst layer is between the helplayer and the substrate, or part of the conducting helplayer between and around the nanostructures when the catalyst layer is on top of the helplayer.

In some implementations, the catalyst layer is on top of the helplayer, and the one or more intermediate layers comprises an exposed patterned metal underlayer. In some implementations, the catalyst layer is between the helplayer and the substrate, and the one or more intermediate layers comprises an exposed insulator layer.

The methods and devices may offer one or more of the following advantages.

In some implementations, the method allows growth of nanostructures on one or more pre-patterned metal underlayer(s) as well as electrically insulating substrates. The method can offer protection against arc damages to electrically sensitive devices contained in the substrates. Limitation on growth plasma containing gases that are incompatible with the metal underlayer(s) or insulating layer(s) can be eliminated.

In some implementations, the method involves depositing a continuous electrically conducting helplayer covering a top surface of the substrate, then depositing (and/or patterning) a catalyst layer over the helplayer, growing the nanostructures on the catalyst layer, and then selectively removing the conducting helplayer in areas not covered by the nanostructures. The method can result in self-aligned fibers growing on the patterned catalyst-helplayer stack. A good grounding for the growth is achieved by the continuous conducting helplayer during the growth process, and it eliminates the arcing problem. Therefore, the method enables growing nanostructures on specifically designated locations on an already patterned metal underlayer(s) or insulating layer(s), as it is easy to remove the conducting helplayer after the nanostructures are grown.

In some implementations, nanostructures are grown through an insulating layer, the method involves depositing a catalyst layer on a substrate (conducting or insulating), then depositing an insulating layer on the catalyst layer, then depositing a continuous patterned conductive helplayer over the insulating layer, selectively removing some parts of the insulating layer to create via holes through the insulating layer down to the catalyst layer, then growing nanostructures from the catalyst layer, and finally selectively removing the conducting helplayer in areas not covered by the nanostructures.

Another advantage of the technology described herein is that sensitive electrical devices on the substrate are protected from the high voltages of the plasma, as all electrical connectors on the chip surface are shorted together and grounded. The technology described herein eliminates substantially all arcs, but even if there are some sparks (for example caused by static electricity during substrate handling) the damaging effect of the sparks is significantly reduced.

A third advantage is that the (possibly patterned) metal underlayer is protected from the plasma during the growth of the nanostructures. This is important when growing nanostructures on a metal underlayer(s) or insulating layer(s) that are not compatible with the gases used for the growth. For example, growth on a copper surface using an acetylene-containing plasma causes detrimental effects during nanostructure growth, as these materials are not always compatible. By utilizing the methods disclosed in this specification, such limitations on compatibility between plasma gases and substrates or metal underlayers can be eliminated.

A fourth advantage is that parasitic growth outside the catalyst is avoided.

As the removal of the conducting helplayer is a self-aligned process, individual nanostructures can be grown on or through an insulating layer/substrate that can remain insulating. This is accomplished by selectively removing the conducting helplayer so that the conducting helplayer material stays just underneath the nanostructures if the helplayer is deposited over the catalyst layer, or is completely removed if the helplayer is positioned on a layer other than the catalyst layer (such as an insulating layer deposited over the catalyst layer and the substrate).

Other features and advantages will be apparent from the description and drawings and from the claims.

LIST OF REFERENCE NUMERALS USED HEREIN

Figure 1A:
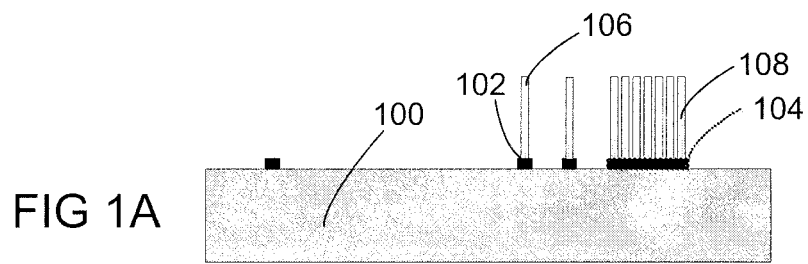
FIGS. 1A-1E illustrate example configurations for growing nanostructures on substrates.
Figure 1B:
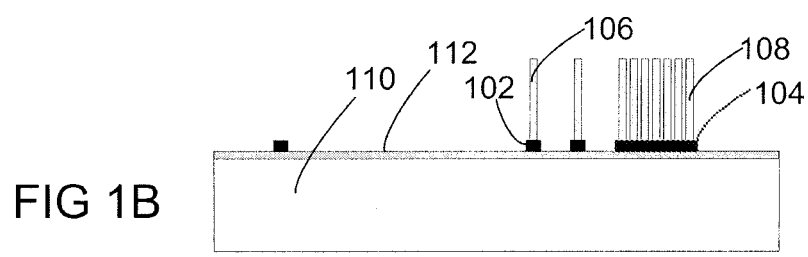
Figure 1C:
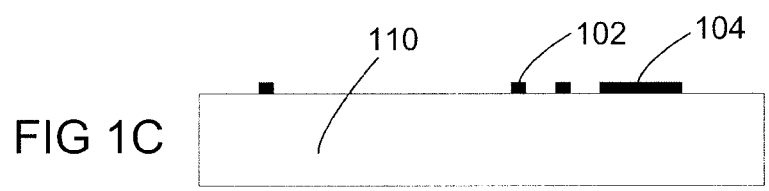
Figure 1D:
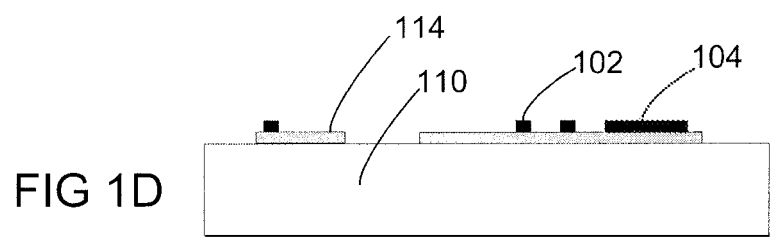
Figure 1E:
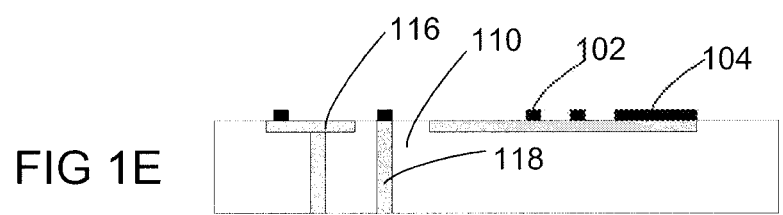
Figure 2:
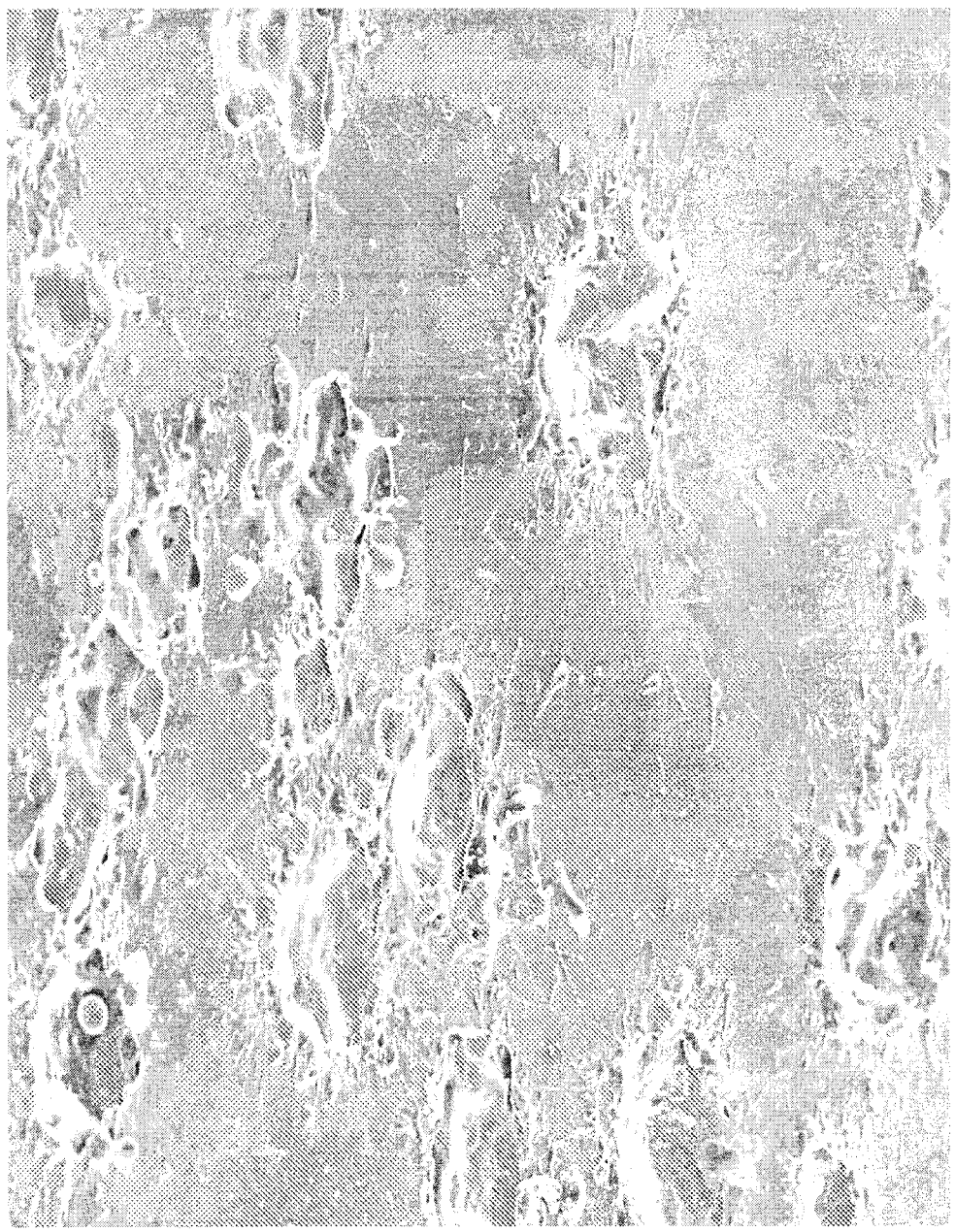
FIG. 2 is an SEM (scanning electron microscope) image showing a spark-damaged chip surface.

The following is a list of reference numerals found on the drawings of the application, with a description of each.
- 100—conducting substrate
- 102—catalyst layer, patterned to support growth of individual nanostructures
- 104—catalyst layer, patterned to support growth of "forests" of nanostructures (multiple closely-spaced nanostructures)
- 106—individual nanostructure
- 108—"forest" of nanostructures (multiple closely-spaced nanostructures)
- 110—insulating substrate
- 112—continuous metal underlayer
- 114—patterned metal underlayer on top of an insulator
- 116—patterned metal underlayer having a top surface that is at the same level as the top surface of the insulating substrate (flat chip after polish)
- 118—via (vertical interconnect)
- 120—continuous conducting helplayer
- 122—residuals of catalyst layer (after self-aligned etching)
- 124—residuals of conducting helplayer (after self-aligned etching)
- 126—optional layer
- 128—substrate for waveguide
- 130—waveguide material
- 132—remaining vertical sidewalls of the conducting helplayer 134—patterned conducting helplayer
136—via hole through an insulator
200—Depositing a conducting helplayer
210—Depositing optional additional layers
220—Depositing and patterning a catalyst layer
230—Growing nanostructures
240—Selective and self-aligned removal of helplayer Like reference numbers and designations in the various drawings indicate like elements.

DETAILED DESCRIPTION

The technology described herein relates to plasma processing, for example, growth of nanostructures (i.e., structures having at least one dimension in the order of nanometers). In some implementations, the technology also applies to processing of structures with feature sizes other than in the nanometer range, for example in the micrometer or millimeter size range.

"Substrate" is a designation of any layer or layers on which other layers can be deposited for the growth of nanostructures. Substrates can include semiconductors containing devices or metal layers or insulators. Semiconductors can include doped or undoped silicon, silicon carbide, II-VI or III-V materials (GaAs, InP, InGaAs etc) or semiconducting polymers. A substrate can also be transparent, conducting or insulating materials such as glass or indium-tin-oxide (ITO). A substrate can also include polymer layers or printed circuit boards (PCBs). A substrate does not need to be flat and can contain corrugated structures.

"Metal underlayer" can include any metal already present on the top surface of a substrate structure before the helplayer is deposited onto the substrate structure, including exposed metal islands (e.g., interconnects or vias) and/or continuous conducting layers that are disposed between the substrate and an exposed insulator layer on top. A metal underlayer can comprise any metal and/or metal alloy or combinations of different metals from the periodic table, such as Cu, Ti, W, Mo, Pt, Al, Au, Pd, Pt, Ni, Fe, etc. A metal underlayer can also comprise one or more conducting alloys such as TiN, WN, AlN. The metal underlayer can also comprise one or more conducting polymers. The metal underlayer can also comprise any combination of the above conducting materials.

"Catalyst" is a metal, alloy or material stack for promoting a chemical reaction. One example catalyst is silicon covered by nickel. The catalyst layer might also include a barrier layer, for example a tungsten layer deposited between a gold layer and the Si/Ni layer on top. A catalyst can be a pure metal such as Ni, Fe, Pt, Pd, or a metal alloy such as NiFe, NiCr, NiAlFe, etc.

"Insulator" can be any electrically insulating material such as silicon dioxide, silicon nitride or high-k materials such as HfO, ZrO, etc., aluminum oxide, sintered composites, polymers, resists (for example SU8), different forms of polyamide, ITO, so called low-k materials, or interlayer dielectrics (ILD).

"Deposited" means any one or more of evaporated, plated, sputtered, or deposited by chemical vapour deposition (CVD) such as thermal or plasma-enhanced CVD, by molecular beam epitaxy (MBE), by pulsed laser deposition (PLD), or by spin-coating.

"Nanostructure" is a structure that has at least one dimension in the order of nanometers. Nanostructures can include nanofibers, nanotubes or nanowires of carbon, GaAs, ZnO, InP, GaN, InGaN, InGaAs, Si, or other materials.

Figure 3A:
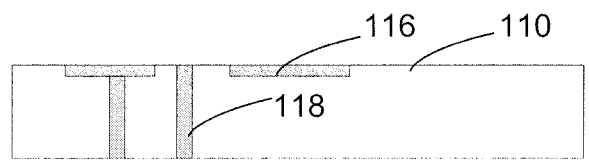
FIGS. 3A-3E illustrate an example process for manufacturing the nanostructures in accordance with the technology disclosed in this specification.

FIG. 3A shows a partly processed substrate such as a silicon chip. The technology described in this specification is applied to the insulating substrate 110 in order to grow nanostructures on the metal islands formed by interconnects 116 and vias 118 (patterned metal underlayer) embedded in the substrate. The vias 118 and interconnects 116 (patterned metal underlayers) can be manufactured according to standard wafer processing methods, for example, the so-called Damascene process, including etching trenches and depositing metals in the trenches. Chemical mechanical polishing (CMP) can be used to achieve a flat top surface of the substrate and interconnects.

Figure 3B:
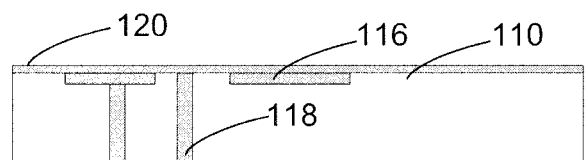
Figure 3C:
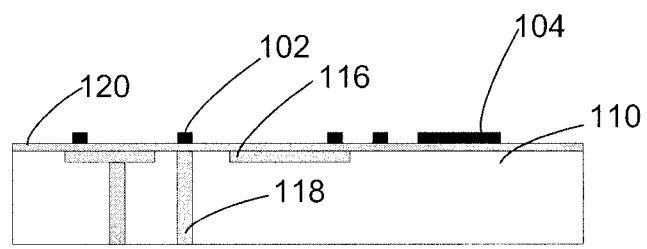
Figure 3D:
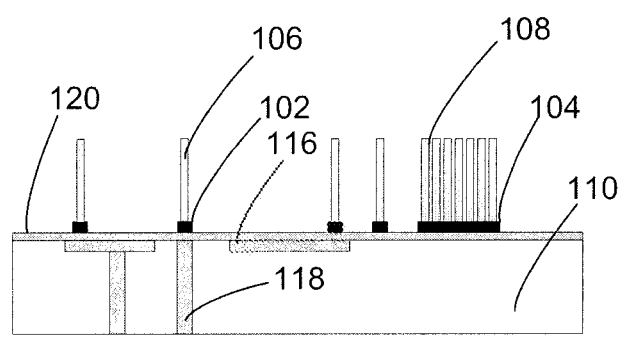
Figure 3E:
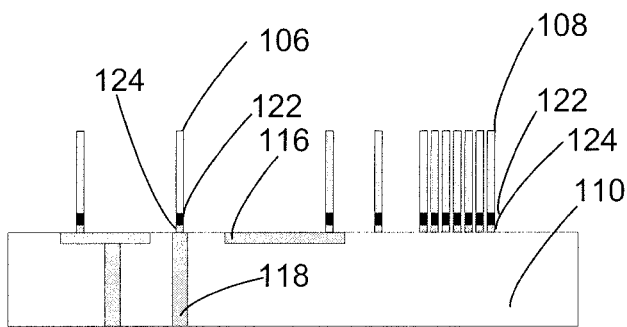
Figure 6:
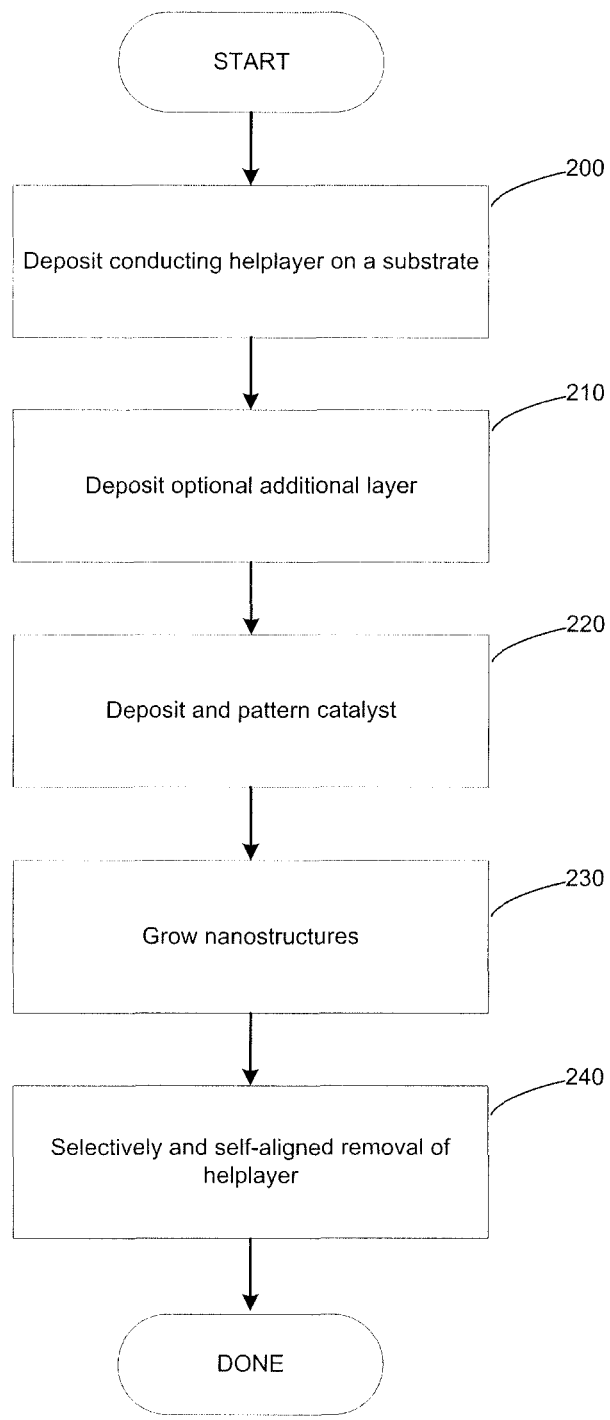
FIG. 6 is a flow diagram of an example process for growing nanostructures on (partly) insulating surfaces.

To manufacture the structures shown in FIG. 3E, a number of steps are performed as shown in FIG. 6. First, a continuous conducting helplayer 120 is deposited (step 200) on the substrate 110 and the patterned metal underlayer 116 and 118 embedded in the substrate 110 to obtain the structure in FIG. 3B. Any electrically conducting material can be used as a helplayer 120. Examples of the conducting materials include any electrically conducting element from the periodic table of elements such as W, Mo etc., conducting alloys such as titanium nitride, semiconductors such as doped silicon, or conducting polymers. The material for the helplayer should be different from the material of the patterned metal underlayer unless a buffer layer separating the metal underlayer and the helplayer is first deposited. In the described example, a tungsten layer was employed as the continuous conducting helplayer 120.

The thickness of the conducting helplayer can be from about 1 nm to 100 µm, and preferably between about 1 nm and 100 nm. In one embodiment, a 50 nm layer of tungsten is used. In some embodiments, only one helplayer is used. However, the technology described herein is not limited to have only a helplayer with a single layer of material, the helplayer can also include multiple layers to improve lift-off, adhesion, etch selectivity or act as an etch stop layer, a seed layer for electroplating or a protection layer. Furthermore, layers for thermal management, for example layers with high or low thermal conductivity such as Peltier materials, can be included.

The technology described herein can be utilized with a number of different materials as the helplayer. It is important to select helplayer materials and etching parameters so that the nanostructures can be used as a self-aligned mask layer during the etching of the helplayer. The choice of the helplayer material can depend on the material lying beneath the helplayer. The helplayer can also be a catalyst, as the selective removal process can also be used to remove any unwanted catalyst residuals between the grown nanostructures.

The patterned catalyst layers 102 and/or 104 define where the nanostructures are to be grown. The catalyst can be nickel, iron, platinum, palladium, nickel-silicide, cobalt, molybdenum or alloys thereof, or can be combined with other materials (e.g., silicon). The catalyst can be optional, as the technology described herein can also be applied in a catalyst-free growth process for nanostructures. A patterned catalyst layer including a small catalyst dot 102 will give rise to an individual nanostructure, and a patterned catalyst layer including a large catalyst area 104 will give rise to a "forest" of nanostructures.

In order to pattern the catalyst layer (step 220 in FIG. 6), standard etch-back or lift-off processing with resist can be used. UV-light or an electron-beam can be used to pattern the resist layer. Other means can also be used to pattern the resist (or the catalyst directly), such as nanoimprint lithography or laser writing. The catalyst layer can also be patterned with methods that do not use a resist, for example, self-assembled chemical methods. An array of catalyst particles can be formed on the surface using Langmuir-Blodgett films, spinning on a solution with catalyst (nano-) particles onto the wafer or depositing a continuous catalyst film which is transformed to catalyst particles during annealing at elevated temperatures. Several of these techniques can be utilized to grow the catalyst layer on non-flat surfaces and to control the growth site density (number of growth sites per unit area).

During growth of the nanostructures, the conducting helplayer can be electrically grounded or connected to the potential of the substrate holder, or to some other suitable grounding potential. The nanostructures 106 and/or 108 can be grown in a plasma (step 230 in FIG. 6), typically a DC-plasma. The plasma gases used for nanostructure growth can be any carbon carrying precursor such as acetylene, carbon monoxide, methane, or higher order hydrocarbon, together with other gases such as ammonia, hydrogen, argon, or nitrogen. The growth temperature is preferably less than 800° C. A pressure ranging from about 0.1 to 250 Torr and preferably between about 0.1 to 100 Torr can be used. The plasma current can range from about 10 mA to 100 A, and preferably about 10 mA to 1 A.

In some implementations, RF-plasma or thermal CVD can be used to grow the nanostructures, and the technology described herein has applications especially for RF-plasmas with a DC-bias. In some implementations, the technology described herein also has application for nanostructures grown in gas-phase (without plasma) and in liquid phase.

In some implementations according to the technology described herein, after the growth step(s), the conductive helplayer is selectively removed by etching (step 240 in FIG. 6). The etching method and etch gases (for the case of dry etch) or etchants (for the case of wet etch) are chosen depending on the materials of the nanostructures and the conducting helplayer. For example, a helplayer comprising tungsten located under carbon nanofibers can be preferably removed by plasma dry etching using a fluorine-containing plasma. An advantage of this combination is the relative selectivity to the nanostructures and the catalyst particles.

Other etching methods, such as other anisotropic etch methods, wet (isotropic) etching, pyrolysis, electrochemical etching or photochemical etching, can be used. By using an etch-stop layer, or varying the etch time, a sufficiently strong etching can be carried out. It can be advantageous to choose an etchant or etch gas that has a relative selectivity between the conducting helplayer and the metal underlayer.

After the removal of the conducting helplayer 120 on specific locations using this self-aligned selective removal process, the final structure will consist of residuals of the conducting helplayer 122 below the residuals of the catalyst layer 124 and nanostructures 106 and/or 108 (see FIG. 3E).

With the method described herein, it is possible to manufacture individual nanostructures 106 or "forests" of nanostructures 108 on isolated metal islands 116 or directly on the insulating substrate 110 as indicated in FIG. 3E.

Figure 4A:
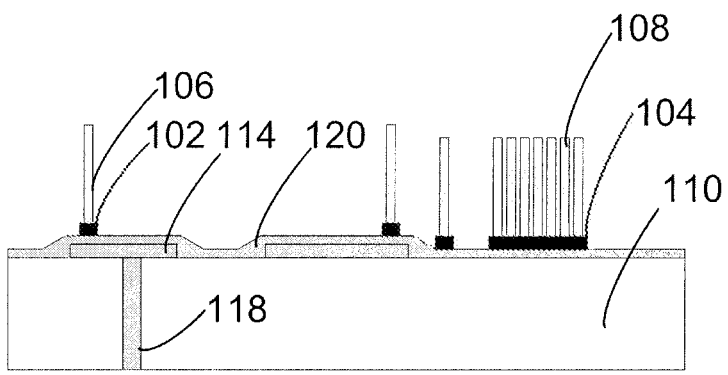
FIGS. 4A-4B and 5A-5B show alternative embodiments of the technology disclosed in this specification.
Figure 4B:
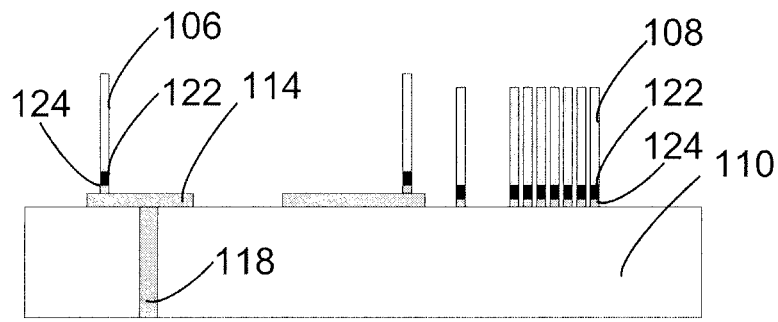

It is also possible to form the nanostructures if the metal underlayer is not at the same level as the rest of the substrate. FIG. 4A illustrates isolated metal islands 114 deposited on top of an insulating substrate 110. The continuous conducting helplayer 120 is deposited over and covering the substrate surface (step 200), and then a patterned catalyst layer 102 and/or 104 is deposited (step 220) on the continuous conducting helplayer. After the growth of nanostructures (step 230) and the self-aligned selective removal (step 240) of the helplayer, the structure will appear as indicated in FIG. 4B.

Figure 5A:
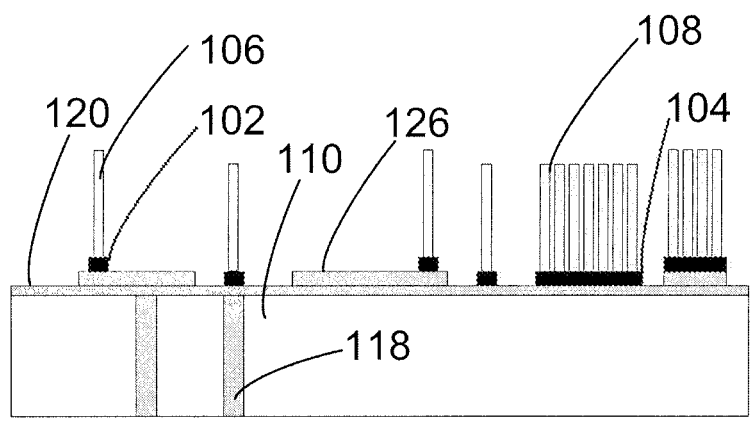
Figure 5B:
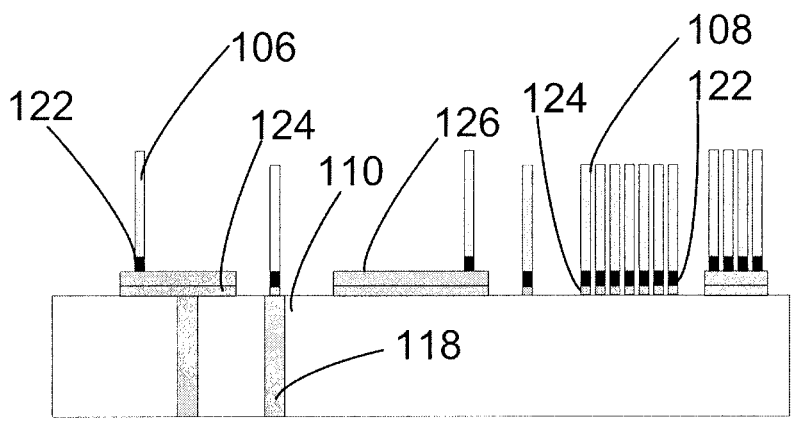

In FIGS. 5A and 5B, a final structure formed by an alternative method is shown. First, the continuous conducting helplayer 120 is deposited throughout the top surface of the substrate (step 200), and then some optional patterned layer 126, for example to permit electrical conduction in the direction perpendicular to the nanostructures, is deposited (step 210) on the helplayer 120. Finally the patterned catalyst 102 and/or 104 is deposited (step 220) on the optional layer or the helplayer. After the growth process (step 230), the helplayer is selectively removed as described in a previous section (step 240). As with other methods described herein, no lithography is necessary after the nanostructure growth. Isolated islands (optional patterned layer 126) with nanostructures 106 and/or 108 on top, and residuals of the helplayer 124 below, are thus manufactured by the method illustrated by FIGS. 5A and 5B.

Figure 8A:
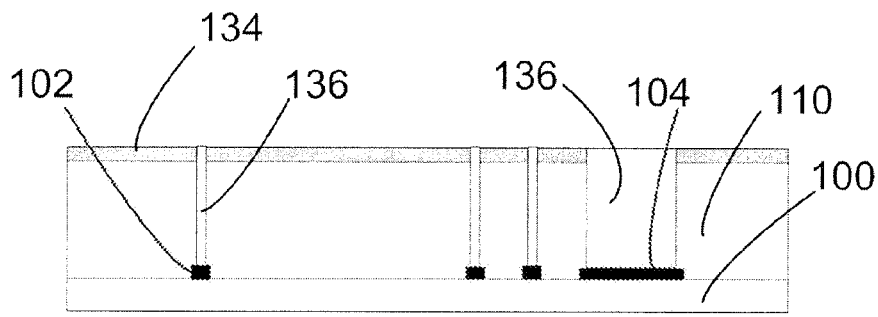
FIGS. 8A-8C illustrate an example process for growing nanostructures through an insulating layer.
Figure 8B:
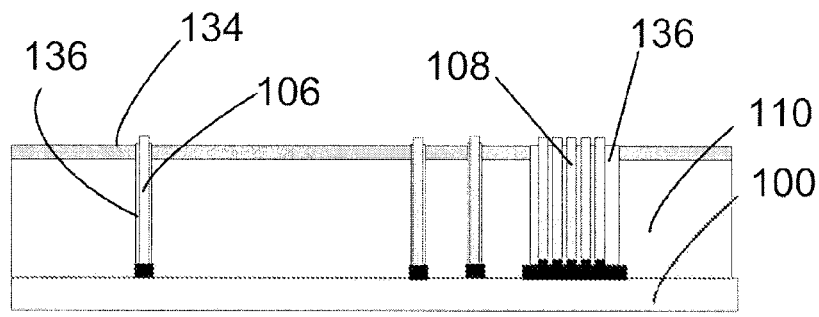
Figure 8C:
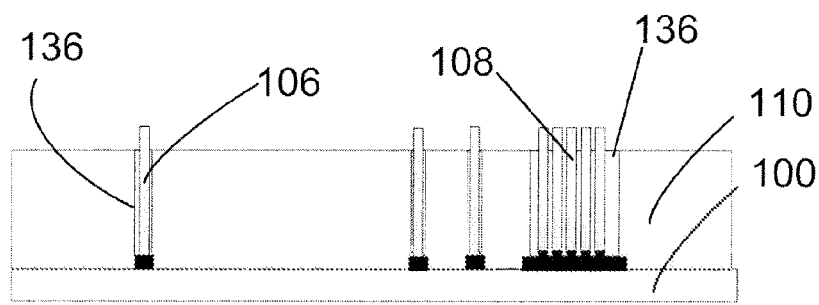

In another embodiment, FIGS. 8A-8C illustrate the method of growing nanostructures through via holes created in an insulating material layer deposited on top of catalyst layer. First the catalyst layer 102 and/or 104 is deposited on a conducting substrate 100. The substrate in this case can however be an insulating substrate as well. An insulating layer 110 is then deposited on the substrate and the catalyst layer. A patterned conducting helplayer 134 is then deposited on top of the insulating layer 110. In some implementations, a continuous conducting helplayer can be deposited on top of the insulating layer first and then patterned by various suitable methods. Holes are then created by selectively etching the insulating layer 110 to create via holes 136 to the catalyst layer. Growth of nanostructures is then carried out to form nanostructures 106 and/or 108 on the catalyst layer 102 and/or 104. The patterned conducting helplayer 134 is then selectively removed (step 240 of FIG. 6), i.e., completely removed in this case.

If required, one of the materials below the conducting helplayer can be etched using an etchant with suitable relative selectivity. For example silicon oxide can be etched using wet or dry etching. Thus the catalyst and nanostructure layers are working as a mask for further processing.

Exemplary Applications

Figure 12:
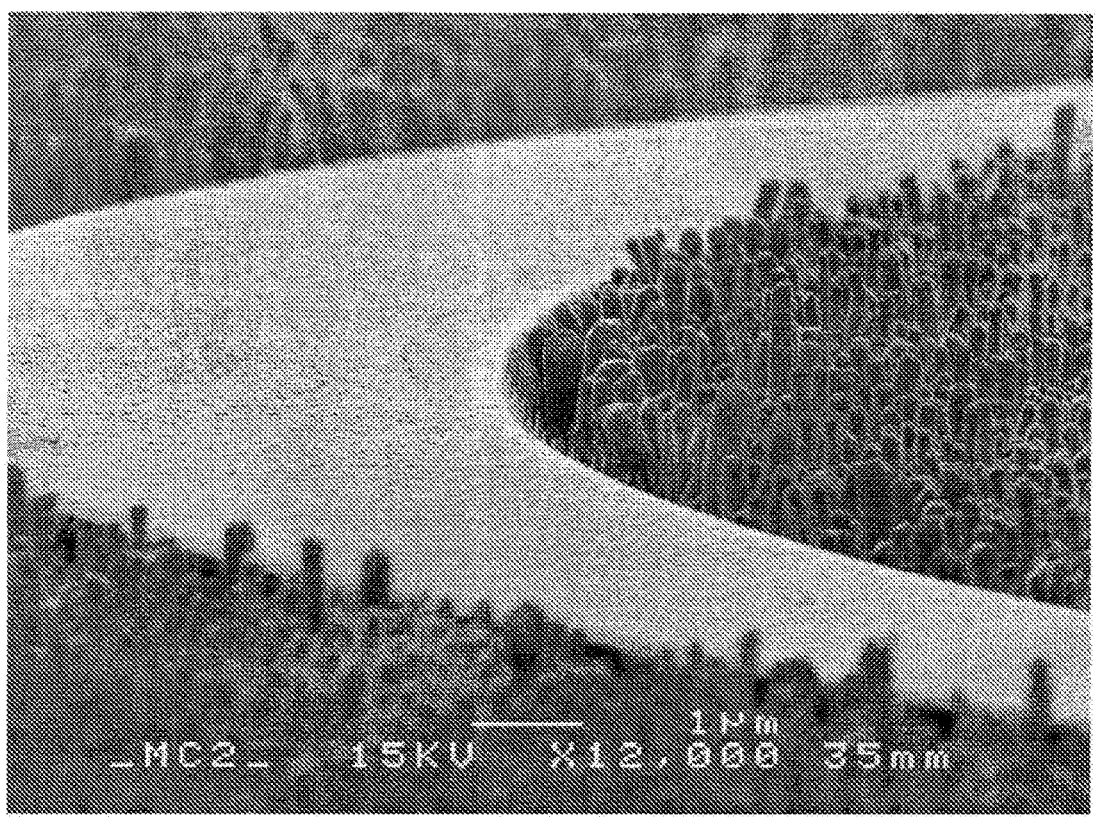
FIG. 12 is an SEM image of an exemplary device where microstructures/nanostructures are grown through via holes in an insulating layer.

An important application for the technology described in this specification is for making interconnects and/or thermal elevators in integrated circuits, which, for example, can be used in computing devices. The nanostructures are used to carry heat and electricity inside the integrated circuit chip or to/from the integrate circuit chip. The growth methods and devices used are compatible with current processing standards which involve patterning metals by polishing, and are also compatible with the metals involved. Also, 3-dimensional stacking of integrated circuits (several device layers) can utilize the nanostructures made with the methods described herein as interconnects. For example, a method is described in FIGS. 8A-8C to utilize the present invention to create via hole interconnect structures. FIG. 12 shows an SEM micrograph of a device where carbon nanostructures are grown through via holes in an oxide insulator as an exemplary device manufactured using the technology and methods described herein. In FIG. 12, the bright flat area is the insulating area and in the rest of the area, vertically grown nanostructures are visible.

Another application is the elimination of parasitic growth. When growing nanostructures on a chip that is only partially covered by a metal underlayer (i.e., by a patterned metal underlayer), there is sometimes a parasitic growth outside the catalyst particles. This can be avoided by using the continuous metal helplayer as described herein.

The technology described herein can also be used to protect the metal underlayer and other exposed materials from the plasma during the growth of nanostructures. This is particularly important when growing nanostructures on a metal underlayer that is not compatible with the gases used for the nanostructure growth. One example is nanostructure growth on a copper surface using acetylene-containing plasma, as copper and acetylene will react with each other. As the conducting helplayer can act as a diffusion barrier for oxygen or other materials of choice from reaching the metal underlayer, unwanted oxidation/chemical reaction/diffusion can be prevented. For example, an aluminum underlayer (if present) can be protected against oxidation by the helplayer. Furthermore, contaminants (for example metal ions) can also be reduced in the nanostructures produced using the method disclosed herein.

The technology described herein can also be used for protecting any sensitive electrical devices in the substrate from the high voltage arcs in the plasma during the nanostructure growth. If, after all, there are any arcs in the plasma, the resulting damage will be significantly reduced as all connectors on the substrate surface are shorted together and grounded by the conducting helplayer. This electrostatic discharge (ESD) protection is also important for handling a wafer in the laboratory or for shipping the partly finished wafer to another laboratory.

The methods described herein can also be used to manufacture thermal bumps on an insulating surface by means of self-aligned removal of the helplayer by plasma etching so that no metal is left except in areas just underneath the nanostructures.

The technology described herein can also be used to manufacture electrical conducting polymeric films and coatings while making the films optically partially transparent, transparent, or non-transparent. Applications can be, for example, making products such as electrode layers in displays, touch screens, electrostatic dissipation (ESD), and shielding etc.

Furthermore, the mechanical properties of the nanostructures created as described herein can be utilized to give mechanical stability to insulators, for example. It is then an advantage that no continuous metal underlayer is required, as the conducting helplayer is selectively removed by plasma etching (except just below the nanostructures) in a self-aligned process.

Thermal interface materials (TIMs), an example of anisotropic conducting films, can be manufactured using the technology described herein. In this case, a layer of nanostructures is embedded in a rubber of polymer designed to help increasing thermal conductivity. The polymer is first spun onto the nanofibers after the helplayer removal, and is then lifted off (with the nanostructures embedded therein). As there is no continuous metal film (since it has been selectively removed) below the polymer film, there is no risk of short-circuiting the different parallel nanostructures in the polymer film.

The conducting helplayer can also supply all nanostructures with the current necessary for electroplating, electrolessplating, or galvanic plating, if this is the next processing step to deposit a metal such as Au, Cu, Al, Ni, etc.

Another application is to make chemical probes directly onto partly insulating substrates. This can for example be done directly on a standard silicon integrated circuit.

The technology described herein can be used to manufacture source, drain and gate metal contact points for a transistor, such as CMOS, Bi-CMOS, Bi-polar, or HEMT etc. Variations of such configuration can be envisaged for particular transistor layouts. Applications also include devices with liquid crystals.

Figure 7A:
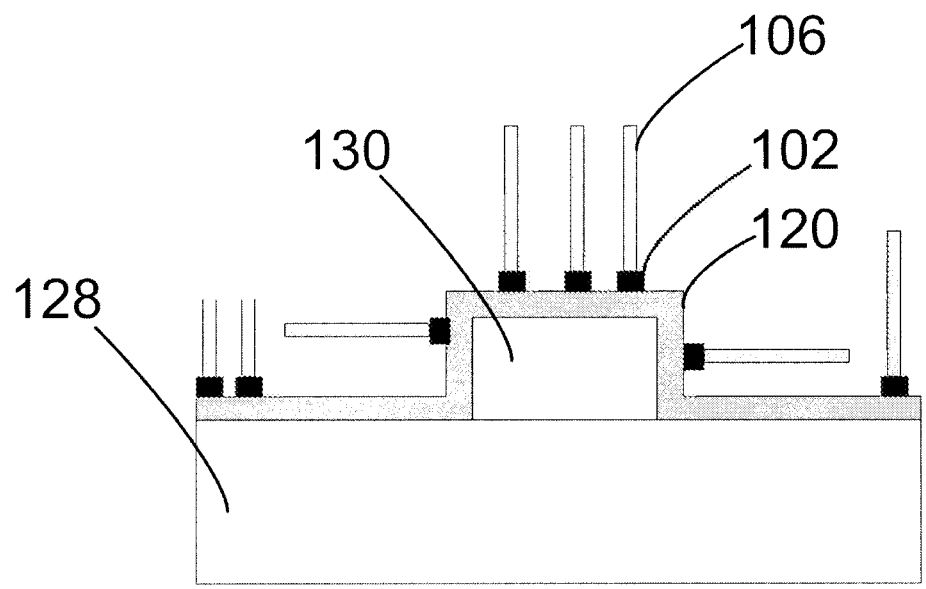
FIGS. 7A-7B show an example optical waveguide structure manufactured using the technology disclosed in this specification.
Figure 7B:
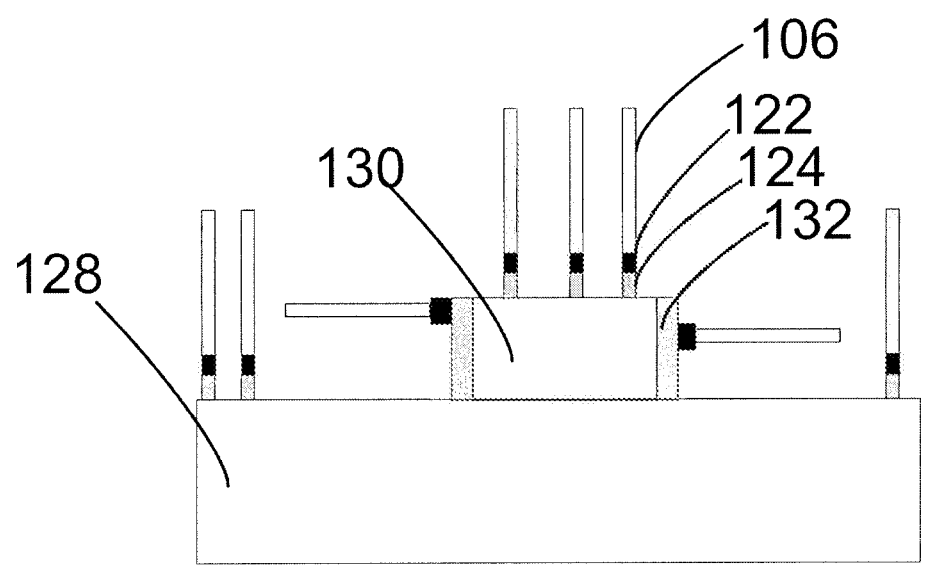

Some applications take advantage of the property that the helplayer can be removed in one-direction-only, if desired. Using anisotropic etch on an appropriately designed substrate structure will leave the helplayer on the vertical surfaces but remove it from the horizontal surfaces. As shown in FIGS. 7A and 7B, a waveguide material 130 is deposited on a suitable substrate 128. The substrate 128 and the waveguide material 130 are covered by a helplayer 120 on the top surface as well as the side walls. By anisotropic etching, the helplayer on the top surface is selectively removed, leaving the side walls intact. As a result, a structure with individual nanofibers 106 grown on an otherwise transparent top surface and metallized sidewalls 132 is created. This structure is useful as an optical absorber for connecting the absorbed light into a waveguide 130 (which consists of the structure with helplayer coated side walls).

The technology described herein also provides a way to rework processing methods. This means that processed wafers can be reworked in case of processing problems/failure simply by removing the nanostructures by chemical mechanical polishing (CMP) to remove the nanostructures and start over the process.

The present technology is applicable for attaching technologies such as ball grid arrays (BGA), flip chip (FC) modules, CSP, WLP, FCOB, TCB etc., IC types, RFID tags, CMOS, BiCMOS, GaAS, HEMT, AlGAAs, MMIC, MCM, LCD, displays, mobile handset, ASIC chips, memory devices, MCU, and integrated passive components etc.

Exemplary Devices

Figure 9A:
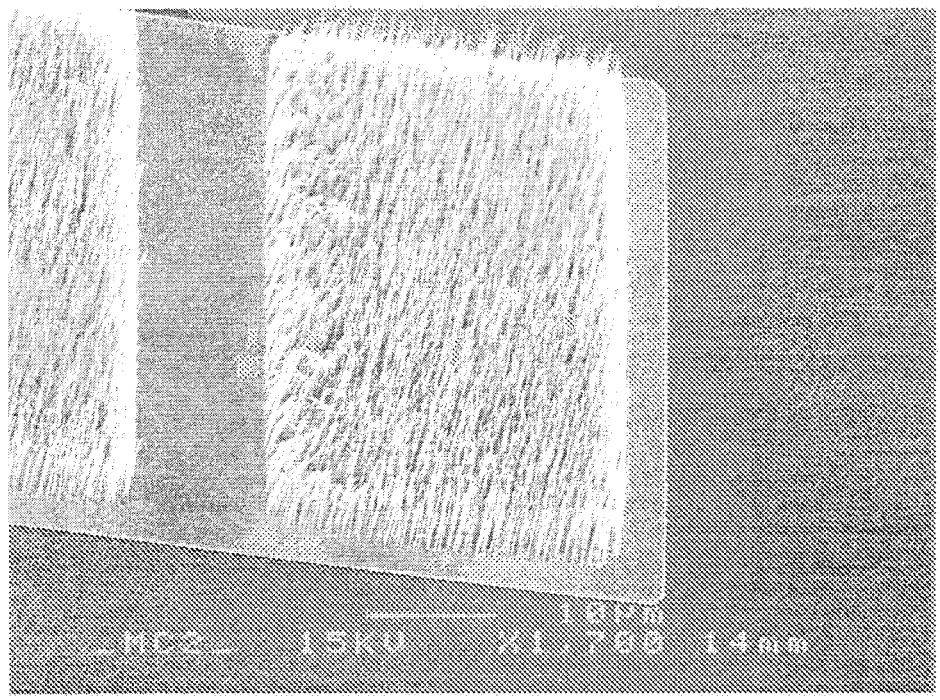
FIGS. 9A-9B are SEM images showing an exemplary device with a patterned metal underlayer, a continuous conducting helplayer and a patterned catalyst layer with grown nanofibers.
Figure 9B:
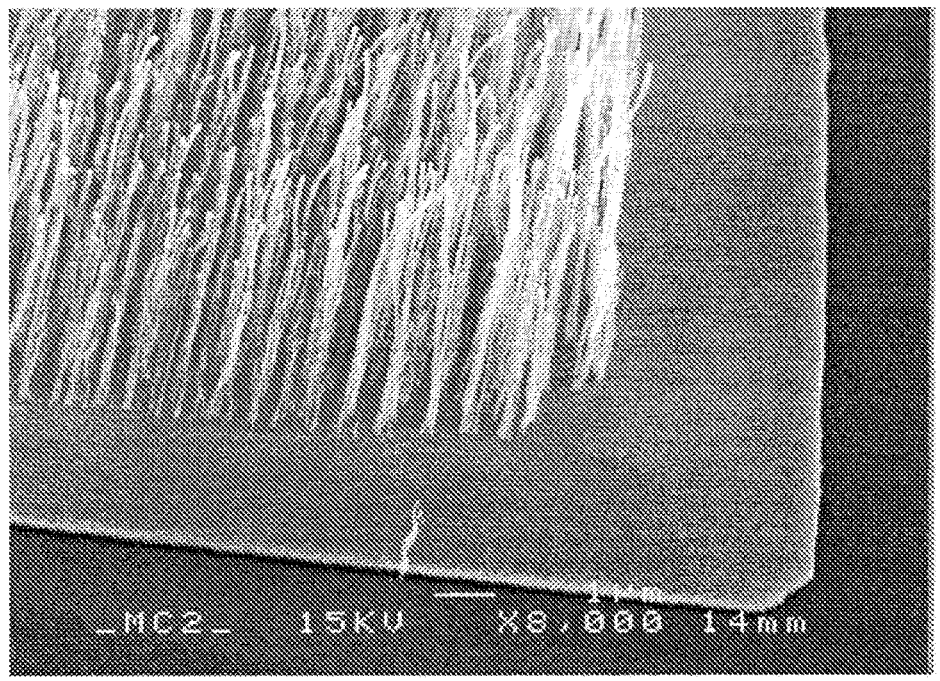

In order to demonstrate the principle, a patterned gold (under-)layer (with a titanium adhesion-promotion layer below) was formed on an otherwise insulating oxide surface (using standard lithographic techniques). It is not desirable to put the catalyst directly on the patterned metal underlayer, as that would give rise to large plasma-induced damages during the growth. Instead, a tungsten helplayer (50 nm) was sputtered all over the chip surface. Then the patterned catalyst layer (Si 10 nm and Ni 10 nm) was formed (aligned with the patterned metal underlayer) by a standard lift off process. After growth, the structures appear as shown in FIGS. 9A and 9B. In this example, the growth temperature was about 700° C., and the plasma was generated in a mixture of $C_2H_2$ and $NH_3$ gases (20 and 100 sccm, respectively) at a pressure of about 4 Torr. The plasma current was set to 20 mA and the growth time was about 60 minutes. In this particular example, the catalyst was patterned such that a film ("forest") of nanofibers resulted after the growth process, but individual vertically aligned nanofibers will result if the catalyst regions are made smaller.

The conducting helplayer was then removed by plasma etching in a fluorine-containing plasma (pressure 10 mTorr, gas flow 20 sccm $CF_4$), and using endpoint detection in a plasma etch CVD processing chamber.

Figure 10:
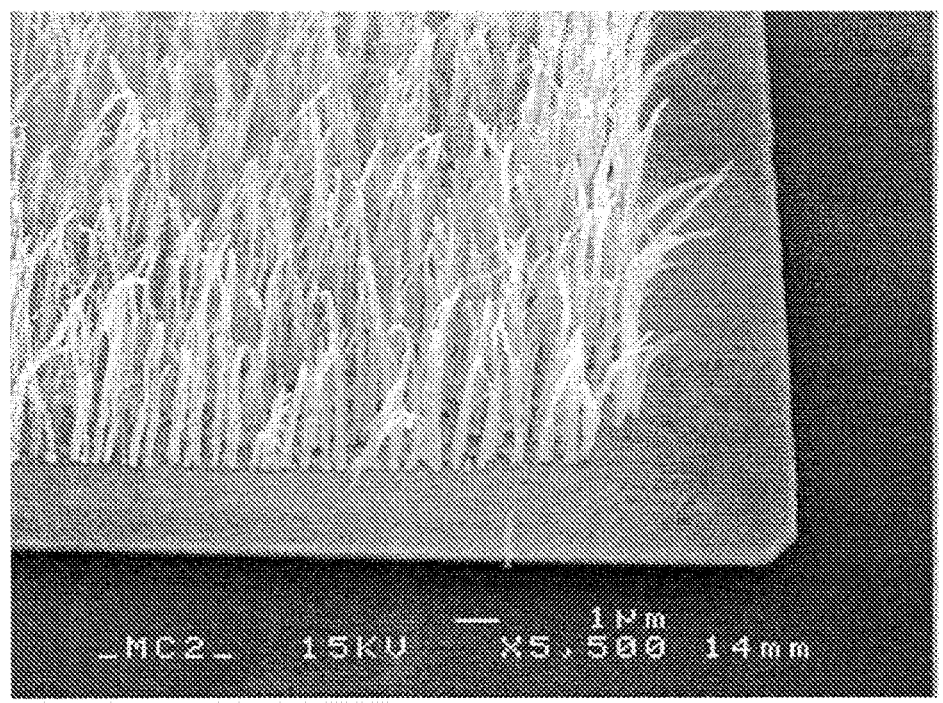
FIG. 10 is an SEM image showing the same exemplary device with the helplayer selectively removed.
Figure 11A:
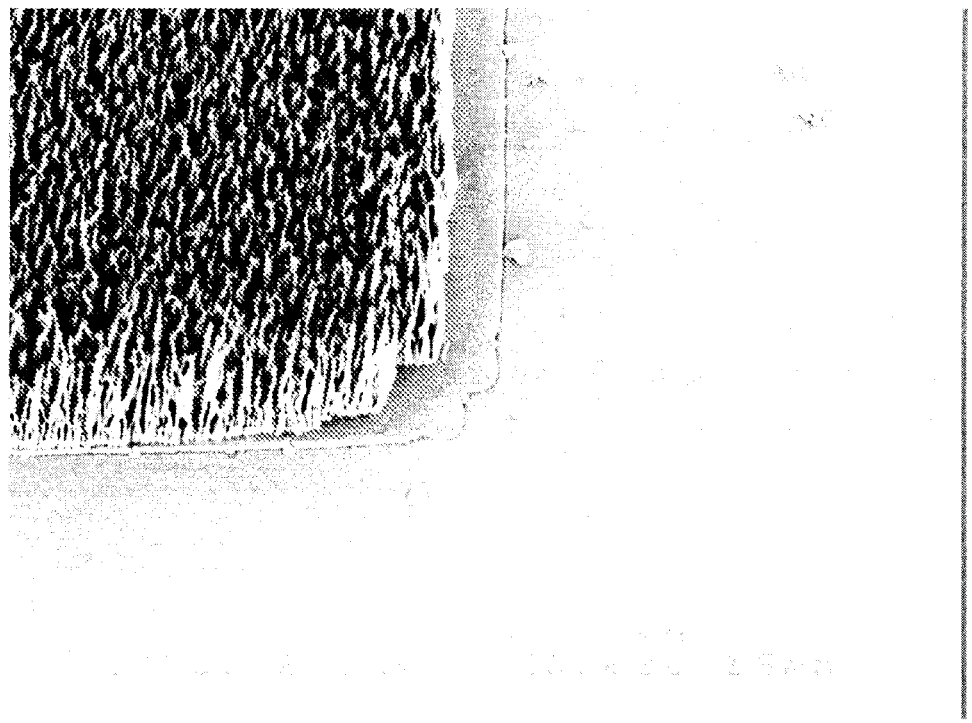
FIGS. 11A-11B are SEM images of exemplary devices with copper as the underlayer, before and after the helplayer removal, respectively.
Figure 11B:
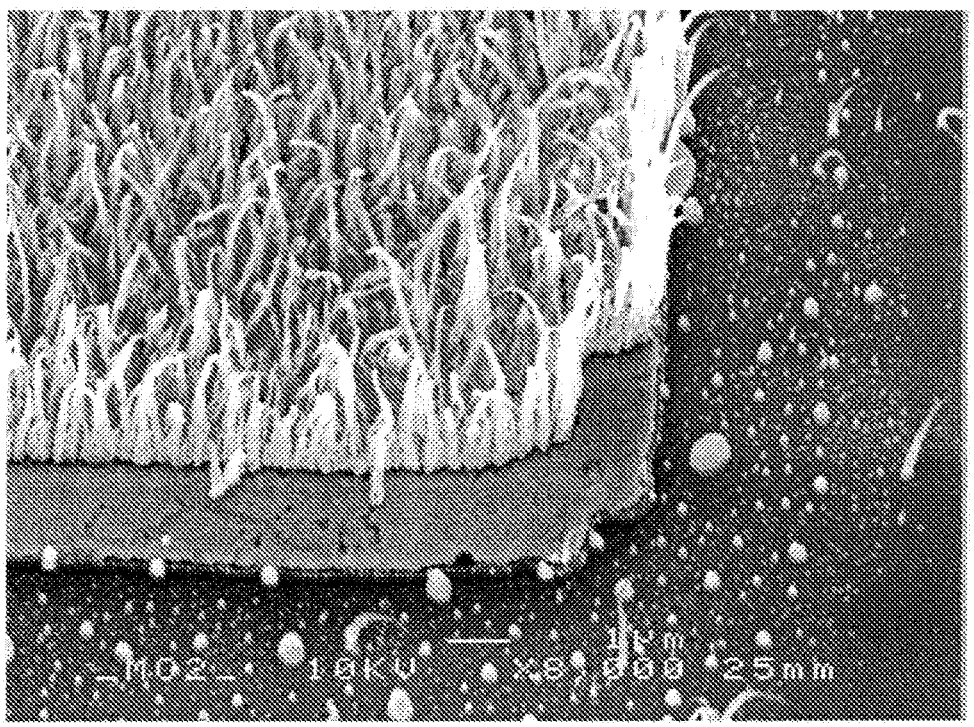

The viability of the method can be shown by the SEM pictures taken before the processing (FIGS. 9A and 9B) and after the processing (FIG. 10). The fibers essentially look the same, despite the fact that the helplayer has been removed. Hence a self-aligned selective removal of the helplayer has been achieved, leaving only parts of the helplayer directly below the fibers remaining on the substrate. The complete removal of the helplayer from the rest of the areas was verified by electrical measurements. Minimal parasitic growth is seen outside the isolated metal island. A similar exemplary device with aluminum as the underlayer is shown in FIG. 11A, and with copper as the underlayer in FIG. 11B, respectively.

Thus the goal of growing nanofibers on a patterned metal underlayer (on an otherwise insulating chip surface) has been achieved without plasma-induced chip damage.

FIG. 12 shows an SEM micrograph of an exemplary device where carbon nanostructures are grown through via holes in an oxide insulator as an exemplary device manufactured using the technology and methods described herein. In FIG. 12, the bright flat area is the insulating area and in the rest of the area, vertically grown nanostructures are visible. Thus the goal of growing nanofibers through via holes in an insulating layer is achieved.

The contents of all patents and other references cited to herein are hereby incorporated by reference in their entirety for all purposes.

While the instant specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombinations. Moreover, although features may be described herein as acting in certain combinations and even initially claimed as such, one or more features from a claimed combination can in some cases be excised from the combination, and the claimed combination may be directed to a subcombination or variation of a subcombination.

What is claimed:

1. A device, comprising:
    a substrate comprising one or more exposed metal islands separated by one or more insulating areas;
    an electrically conducting helplayer deposited on the one or more exposed metal islands and on the one or more insulating areas;
    a catalyst layer deposited on the electrically conducting helplayer;
    one or more nanostructures arranged on the one or more exposed metal islands; and
    one or more nanostructures arranged on the one or more insulating areas,
    wherein the electrically conducting helplayer and the catalyst layer are present only directly below said one or more nanostructures.

2. The device according to claim 1, wherein the one or more nanostructures comprises carbon, GaAs, ZnO, InP, InGaAs, GaN, InGaN, or Si.

3. The device according to claim 1, wherein the one or more nanostructures includes nanofibers, nanotubes, or nanowires.

4. The device according to claim 1, wherein the conducting helplayer comprises a material selected from: a metal, a semiconductor, a conducting polymer, and an alloy.

5. The device according to claim 1, wherein the conducting helplayer is from 1 nm to 100 µm thick.

6. The device according to claim 1, wherein the electrically conducting helplayer has been patterned by etching using the plurality of nanostructures as a self-aligned mask.

7. A method for making the device according to claim 1, the method comprising:
    depositing a conducting helplayer on an upper surface of a substrate, the substrate including exposed metal islands separated by one or more insulating areas;
    depositing a patterned layer of catalyst on the conducting helplayer;
    growing the one or more nanostructures on the layer of catalyst with at least one nanostructure arranged on the one or more exposed metal islands and at least one nanostructure arranged on the one or more insulating areas; and
    selectively removing the conducting helplayer between and around the one or more nanostructures to form the device of claim 1.

8. The method of claim 7, wherein the layer of catalyst is patterned after it is deposited.

9. The method of claim 7, wherein the substrate additionally comprises a metal underlayer, co-extensive with its upper surface, and which is covered by the conducting helplayer.

10. The method of claim 9, wherein the metal underlayer is patterned.

11. The method of claim 9, wherein the metal underlayer comprises one or more metals selected from: Cu, Ti, W, Mo, Pt, Al, Au, Pd, P, Ni, and Fe.

12. The method of claim 9, wherein the metal underlayer comprises one or more conducting alloys selected from: TiN, WN, and AlN.

13. The method of claim 9, wherein the underlayer comprises one or more conducting polymers.

14. The method of claim 7, wherein the substrate is a semiconductor.

15. The method of claim 7, wherein the substrate is an insulator.

16. The method of claim 7, wherein the substrate comprises an insulator with at least one conducting layer on top.

17. The method of claim 7, wherein any of the depositing is carried out by a method selected from: evaporating, plating, sputtering, molecular beam epitaxy, pulsed laser depositing, CVD, and spin-coating.

18. The method of claim 7, wherein the one or more nanostructures comprises carbon, GaAs, ZnO, InP, InGaAs, GaN, InGaN, or Si.

19. The method of claim 7, wherein the one or more nanostructures includes nanofibers, nanotubes, or nanowires.

20. The method of claim 7, wherein the conducting helplayer comprises a material selected from: a metal, a semiconductor, a conducting polymer, and an alloy.

21. The method of claim 7, wherein the conducting helplayer is from 1 nm to 100 µm thick.

22. The method of claim 7, wherein the one or more nanostructures are grown in a plasma.

23. The method of claim 7, wherein the selective removal of the conducting helplayer is accomplished by etching.

24. The method of claim 23, wherein the etching is plasma dry etching.

25. The method of claim 23, wherein the etching is an electrochemical etching.

26. The method of claim 23, wherein the etching is photochemical pyrolysis etching.

27. The method of claim 23, wherein the etching is pyrolysis etching.

28. The method of claim 7, further comprising depositing an additional layer between the conducting helplayer and the layer of catalyst.

* * * * *